United States Patent
Hou et al.

(10) Patent No.: US 9,564,416 B2
(45) Date of Patent: Feb. 7, 2017

(54) PACKAGE STRUCTURES AND METHODS OF FORMING THE SAME

(71) Applicant: Taiwan Semiconductor Manufacturing Company, Ltd., Hsin-Chu (TW)

(72) Inventors: Hao-Cheng Hou, Hsin-Chu (TW); Ming-Che Liu, Hsin-Chu (TW); Chun-Chih Chuang, Taichung (TW); Jung Wei Cheng, Hsin-Chu (TW); Tsung-Ding Wang, Tainan (TW); Hung-Jen Lin, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/696,054

(22) Filed: Apr. 24, 2015

(65) Prior Publication Data

US 2016/0240508 A1    Aug. 18, 2016

Related U.S. Application Data

(60) Provisional application No. 62/115,999, filed on Feb. 13, 2015.

(51) Int. Cl.
*H01L 23/02* (2006.01)
*H01L 25/065* (2006.01)
(Continued)

(52) U.S. Cl.
CPC ...... *H01L 25/0652* (2013.01); *H01L 21/76802* (2013.01); *H01L 21/76877* (2013.01);
(Continued)

(58) Field of Classification Search
CPC .............. H01L 2224/0231; H01L 2224/02373; H01L 21/56; H01L 21/563; H01L 2224/32145; H01L 2225/1058; H01L 2924/181; H01L 2924/14; H01L 2224/16145
(Continued)

(56) References Cited

U.S. PATENT DOCUMENTS 4,728,751 A    3/1988    Canestaro et al.
4,811,082 A    3/1989    Jacobs et al.
(Continued)

FOREIGN PATENT DOCUMENTS

JP    2008103536 A    5/2008
JP    4339309 B2    10/2009
(Continued)

OTHER PUBLICATIONS

Ranganathan, N., et al., "Integration of High Aspect Ratio Tapered Silicon Via for Through-Silicon Interconnection," 58th Electronic Components and Technology Conference, ECTC 2008., May 2008, pp. 859-865, IEEE, Lake Buena Vista, Florida, United States.

*Primary Examiner* — S. V. Clark
(74) *Attorney, Agent, or Firm* — Slater Matsil, LLP

(57) ABSTRACT

Packages structure and methods of forming them are discussed. A structure includes a first die, a first encapsulant at least laterally encapsulating the first die, and a redistribution structure on the first die and the first encapsulant. The second die is attached by an external electrical connector to the redistribution structure. The second die is on an opposite side of the redistribution structure from the first die. A second encapsulant is on the redistribution structure and at least laterally encapsulates the second die. The second encapsulant has a surface distal from the redistribution structure. A conductive feature extends from the redistribution structure through the second encapsulant to the surface of the second encapsulant. A conductive pillar is on the
(Continued)

conductive feature, and the conductive pillar protrudes from the surface of the second encapsulant.

20 Claims, 27 Drawing Sheets

(51) Int. Cl.
| | | |
|---|---|---|
| H01L 23/528 | (2006.01) | |
| H01L 23/522 | (2006.01) | |
| H01L 25/00 | (2006.01) | |
| H01L 21/768 | (2006.01) | |
| H01L 23/31 | (2006.01) | |
| H01L 23/538 | (2006.01) | |
| H01L 23/00 | (2006.01) | |
| H01L 21/56 | (2006.01) | |

(52) U.S. Cl.
CPC ........ *H01L 23/3121* (2013.01); *H01L 23/528* (2013.01); *H01L 23/5226* (2013.01); *H01L 23/5389* (2013.01); *H01L 24/19* (2013.01); *H01L 24/20* (2013.01); *H01L 25/0657* (2013.01); *H01L 25/50* (2013.01); *H01L 21/56* (2013.01); *H01L 21/568* (2013.01); *H01L 2224/04105* (2013.01); *H01L 2224/12105* (2013.01); *H01L 2224/16227* (2013.01); *H01L 2224/32225* (2013.01); *H01L 2224/73204* (2013.01); *H01L 2224/73267* (2013.01); *H01L 2224/81005* (2013.01); *H01L 2224/81815* (2013.01); *H01L 2224/92125* (2013.01); *H01L 2225/06513* (2013.01); *H01L 2225/06517* (2013.01); *H01L 2225/06541* (2013.01); *H01L 2924/15311* (2013.01); *H01L 2924/16251* (2013.01); *H01L 2924/18161* (2013.01); *H01L 2924/18162* (2013.01)

(58) Field of Classification Search
USPC ........ 257/686, 777, 787, 778; 438/107, 108, 438/109, 110, 127
See application file for complete search history.

(56) References Cited

U.S. PATENT DOCUMENTS

| | | | |
|---|---|---|---|
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 5,818,404 A | 10/1998 | Lebby et al. | |
| 5,895,978 A | 4/1999 | Palagonia | |
| 6,002,177 A | 12/1999 | Gaynes et al. | |
| 6,025,648 A | 2/2000 | Takahashi et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,603,072 B1 | 8/2003 | Foster et al. | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,791,195 B2 | 9/2004 | Urushima | |
| 6,879,041 B2 | 4/2005 | Yamamoto et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,098,542 B1 | 8/2006 | Hoang et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,217,994 B2 | 5/2007 | Zhu et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,632,719 B2 | 12/2009 | Choi et al. | |
| 7,659,632 B2 | 2/2010 | Tsao et al. | |
| 7,834,450 B2 | 11/2010 | Kang | |
| 7,928,582 B2 | 4/2011 | Hutto | |
| 8,164,171 B2 * | 4/2012 | Lin .................. | H01L 23/49816 257/685 |
| 8,284,561 B2 | 10/2012 | Su et al. | |
| 8,361,842 B2 | 1/2013 | Yu et al. | |
| 8,519,537 B2 | 8/2013 | Jeng et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,796,846 B2 * | 8/2014 | Lin ..................... | H01L 21/6835 257/686 |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,896,109 B2 * | 11/2014 | Pagaila .................. | H01L 25/16 257/678 |
| 8,970,023 B2 * | 3/2015 | Chou ..................... | H01L 24/11 257/685 |
| 2002/0003232 A1 | 1/2002 | Ahn et al. | |
| 2002/0003297 A1 | 1/2002 | Smola et al. | |
| 2002/0081755 A1 | 6/2002 | Degani et al. | |
| 2003/0035270 A1 | 2/2003 | Shieh et al. | |
| 2004/0056344 A1 | 3/2004 | Ogawa et al. | |
| 2006/0145328 A1 | 7/2006 | Hsu | |
| 2006/0249828 A1 | 11/2006 | Hong | |
| 2007/0289127 A1 | 12/2007 | Hurwitz et al. | |
| 2008/0116589 A1 | 5/2008 | Li et al. | |
| 2008/0248610 A1 | 10/2008 | Chew et al. | |
| 2008/0265434 A1 | 10/2008 | Kurita | |
| 2008/0272477 A1 | 11/2008 | Do et al. | |
| 2008/0283992 A1 | 11/2008 | Palaniappan et al. | |
| 2008/0315372 A1 | 12/2008 | Kuan et al. | |
| 2009/0065927 A1 | 3/2009 | Meyer | |
| 2009/0121326 A1 | 5/2009 | Kim et al. | |
| 2009/0186446 A1 | 7/2009 | Kwon et al. | |
| 2009/0230531 A1 | 9/2009 | Do et al. | |
| 2009/0309212 A1 | 12/2009 | Shim et al. | |
| 2009/0321921 A1 | 12/2009 | Hwang | |
| 2010/0019370 A1 | 1/2010 | Pressel et al. | |
| 2010/0052135 A1 * | 3/2010 | Shim ..................... | H01L 21/568 257/686 |
| 2010/0102428 A1 | 4/2010 | Lee et al. | |
| 2010/0244219 A1 | 9/2010 | Pagaila et al. | |
| 2010/0314749 A1 | 12/2010 | Kurita | |

(56) References Cited

U.S. PATENT DOCUMENTS

| | | |
|---|---|---|
| 2011/0024888 A1 | 2/2011 | Pagaila et al. |
| 2011/0241192 A1* | 10/2011 | Ding .................. H01L 21/6835 |
| | | 257/686 |
| 2011/0278732 A1 | 11/2011 | Yu et al. |
| 2011/0285005 A1 | 11/2011 | Lin et al. |
| 2011/0291288 A1 | 12/2011 | Wu et al. |
| 2011/0304999 A1 | 12/2011 | Yu et al. |
| 2012/0049352 A1 | 3/2012 | Kang et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0119533 A1 | 5/2013 | Chen et al. |
| 2013/0168848 A1 | 7/2013 | Lin et al. |
| 2013/0214426 A1 | 8/2013 | Zhao et al. |
| 2013/0307140 A1 | 11/2013 | Huang et al. |
| 2014/0203429 A1 | 7/2014 | Yu et al. |
| 2014/0217610 A1 | 8/2014 | Jeng et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0353823 A1 | 12/2014 | Park et al. |
| 2015/0235915 A1 | 8/2015 | Liang et al. |

FOREIGN PATENT DOCUMENTS

| | | |
|---|---|---|
| KR | 20090122277 A | 11/2009 |
| KR | 20120019091 A | 3/2012 |
| KR | 20130077031 A | 7/2013 |

* cited by examiner

PACKAGE STRUCTURES AND METHODS OF FORMING THE SAME

PRIORITY CLAIM AND CROSS-REFERENCE

This application claims priority to and the benefit of U.S. Provisional Application Ser. No. 62/115,999, filed on Feb. 13, 2105 and entitled "Package Structures and Methods of Forming the Same," which application is hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
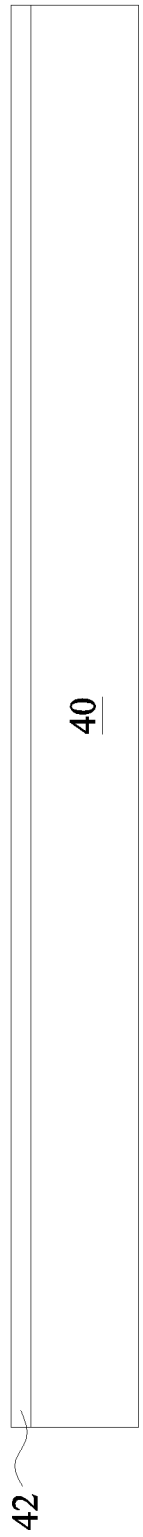
FIGS. 1 through 14 are cross-sectional views of various stages of manufacturing a first package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely die(s)-on-package configurations with a fan-out or fan-in wafer-level package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 14 illustrate cross-sectional views of various stages of manufacturing a first package structure in accordance with some embodiments. FIG. 1 is a cross-sectional view of a carrier substrate 40 and a release layer 42 on the carrier substrate 40. The carrier substrate 40 may be a glass carrier substrate, a ceramic substrate, or the like. The carrier substrate 40 may be a wafer on which multiple package structures are formed, as discussed subsequently. The release layer 42 may be formed of a polymer-based material, which may be removed along with the carrier substrate 40 from the overlying structures that will be formed in subsequent steps. In some embodiments, the release layer 42 is an epoxy-based thermal release material, which loses its adhesive property when heated, such as a Light-to-Heat-Conversion (LTHC) release coating. In other embodiments, the release layer 42 may be an ultra-violet (UV) glue, which loses its adhesive property when exposed to UV light. The release layer 42 may be dispensed as a liquid and cured, may be a laminate film laminated onto the carrier substrate 40, or may be the like.

Figure 2:
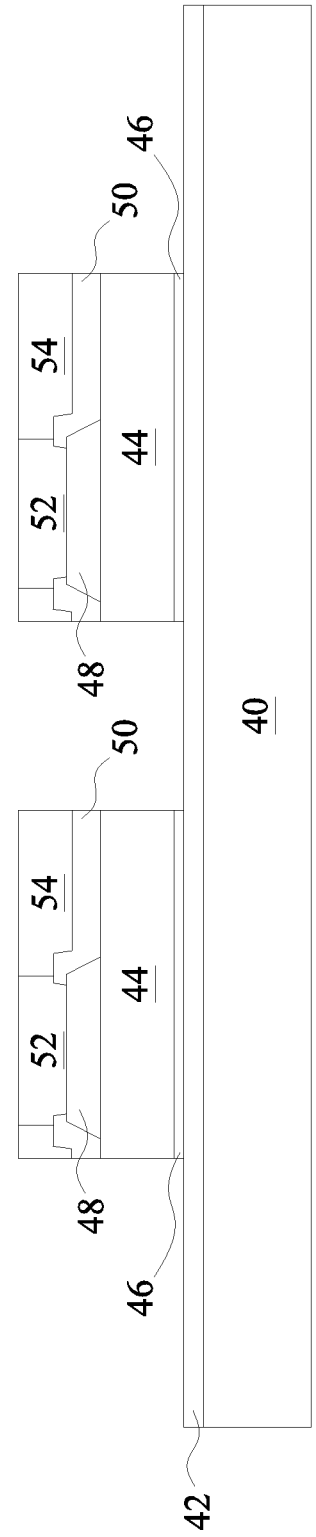

FIG. 2 is a cross-sectional view of integrated circuit dies 44 attached to the carrier substrate 40. Integrated circuit dies 44 are adhered to the release layer 42 by an adhesive 46. As illustrated, two integrated circuit dies 44 are adhered, and in other embodiments, one integrated circuit die or more integrated circuit dies may be adhered. The integrated circuit dies 44 can be a processor, a memory chip, logic chip, analog chip, digital chip, or the like. Before being adhered to the release layer 42, the integrated circuit dies 44 may be processed according to applicable manufacturing processes to form integrated circuits in the integrated circuit dies 44. For example, the integrated circuit dies 44 may each comprise a bulk semiconductor substrate, a semiconductor-on-insulator (SOI) substrate, multi-layered or gradient substrates, or the like. An SOI substrate comprises a layer of a semiconductor material formed on an insulator layer, such as a buried oxide (BOX), silicon oxide, or the like. A semiconductor material of the substrate can be an elemental semiconductor, such as silicon, germanium, or the like; compound and/or alloy material such as silicon germanium, silicon carbide, gallium arsenic, indium arsenide, indium phosphide, silicon germanium carbide, gallium arsenic phosphide, gallium indium phosphide, a combination of these, and the like. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

The integrated circuit dies 44 further comprise pads 48, such as aluminum pads, to which external connections are made. The pads 48 are on what may be referred to as respective active sides of the integrated circuit dies 44. Passivation films 50 are on the integrated circuit dies 44 and on portions of the pads 48. Openings are through the passivation films 50 to the pads 48. Die connectors 52, such as conductive pillars (for example, comprising a metal such as copper), are in the openings through passivation films 50 and are mechanically and electrically coupled to the respective pads 48. The die connectors 52 may be formed by, for example, plating or the like. The die connectors 52 electrically couple the respective integrated circuits of the integrated circuit dies 44. One die connector 52 is shown on each integrated circuit die 44 for clarity and simplicity, and one of ordinary skill in the art will readily understand that more than one die connector 52 may be present.

A dielectric material 54 is on the active sides of the integrated circuit dies 44, such as on the passivation films 50 and the die connectors 52. The dielectric material 54 laterally encapsulates the die connectors 52, and in some embodiments, the dielectric material 54 fully covers and encapsulates the die connector 52. The dielectric material 54 is laterally co-terminus with the respective integrated circuit dies 44. The dielectric material 54 may be a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof, and may be formed, for example, by spin coating, lamination, Chemical Vapor Deposition (CVD), or the like.

Adhesive 46 is on back sides of the integrated circuit dies 44 and adheres the integrated circuit dies 44 to the release layer 42 and the carrier substrate 40 in the illustration. The adhesive 46 may be any suitable adhesive, epoxy, or the like. The adhesive 46 may be applied to a back side of the integrated circuit dies 44, such as to a back side of the respective semiconductor wafer before the integrated circuit dies 44 are singulated. The integrated circuit dies 44 may be singulated, such as by sawing or dicing, and adhered to the release layer 42 by the adhesive 46 using, for example, a pick-and-place tool.

Figure 3:
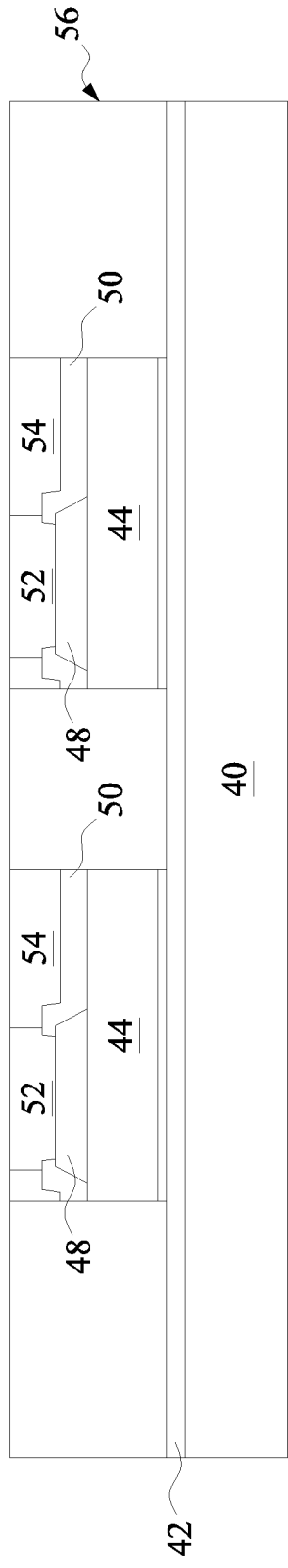

FIG. 3 illustrates the formation of an encapsulant 56 encapsulating the integrated circuit dies 44. As illustrated, the encapsulant 56 laterally encapsulates the integrated circuit dies 44 and the components formed thereon. The encapsulant 56 may be a molding compound, epoxy, or the like, and may be applied by compression molding, transfer molding, or the like. In some embodiments, after being applied, the encapsulant is over the integrated circuit dies 44. After curing, the encapsulant 56 can undergo a grinding process, such as a chemical-mechanical polishing (CMP) or the like, to expose the die connectors 52. Top surfaces of the die connectors 52, dielectric material 54, and encapsulant 56 are co-planar after the grinding process. In some embodiments, the grinding may be omitted, for example, if die connectors 52 are already exposed.

Figure 4:
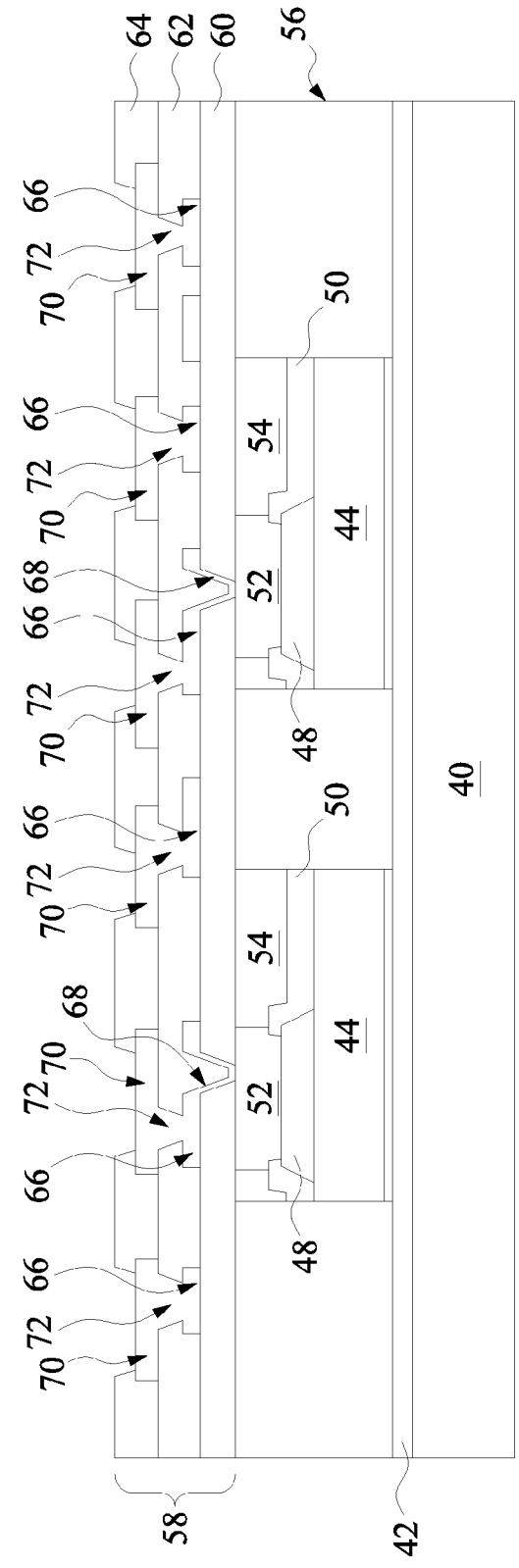

FIG. 4 illustrates the formation of a redistribution structure 58 on the integrated circuit dies 44 and the encapsulant 56. The redistribution structure 58 can comprise any number of dielectric layers, metallization patterns, and vias. As illustrated, the redistribution structure 58 includes three dielectric layers 60, 62, 64 with respective metallization patterns and vias, as will be discussed below.

The first dielectric layer 60 is formed on the encapsulant 56, dielectric material 54, and die connectors 52. In some embodiments, the first dielectric layer 60 is formed of a polymer, which may be a photo-sensitive material such as PBO, polyimide, BCB, or the like, that may be easily patterned using lithography. In other embodiments, the first dielectric layer 60 is formed of a nitride such as silicon nitride; an oxide such as silicon oxide, PSG, BSG, BPSG, or the like. The first dielectric layer 60 may be formed by spin coating, lamination, CVD, the like, or a combination thereof. The first dielectric layer 60 is then patterned to form openings to expose portions of the die connectors 52. The patterning may be by an acceptable process, such as by exposing the first dielectric layer 60 to light when the dielectric layer is a photo-sensitive material or by etching using, for example, an anisotropic etch.

First metallization pattern 66 with vias 68 is formed on the first dielectric layer 60. As an example to form first metallization pattern 66 and vias 68, a seed layer (not shown) is formed over the first dielectric layer 60 and in the openings formed in the first dielectric layer 60. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photo resist is then formed and patterned on the seed layer. The photo resist may be formed by spin coating or the like and may be exposed to light for patterning. The pattern of the photo resist corresponds to the first metallization pattern 66 with vias 68. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the first metallization pattern 66 and vias 68.

A second dielectric layer 62, second metallization pattern 70, and vias 72 are formed on the first dielectric layer 60 and first metallization pattern 66. The second dielectric layer 62, second metallization pattern 70, and vias 72 can be formed by repeating the process with similar materials for forming the first dielectric layer 60, first metallization pattern 66, and vias 68 as discussed above. The vias 72 interconnect metallization patterns 66 and 70.

A third dielectric layer 64 is formed on the second dielectric layer 62 and second metallization pattern 70. In some embodiments, the third dielectric layer 64 is formed of a polymer, which may be a photo-sensitive material such as PBO, polyimide, BCB, or the like, that may be easily patterned using a lithography mask. In other embodiments, the third dielectric layer 64 is formed of a nitride such as silicon nitride; an oxide such as silicon oxide, PSG, BSG, BPSG, or the like. The third dielectric layer 64 may be formed by spin coating, lamination, CVD, the like, or a combination thereof. The third dielectric layer 64 is then patterned to form openings to expose second metallization pattern 70. The patterning may be by an acceptable process, such as by exposing the third dielectric layer 64 to light when the dielectric layer is a photo-sensitive material or by etching using, for example, an anisotropic etch.

Figure 5:
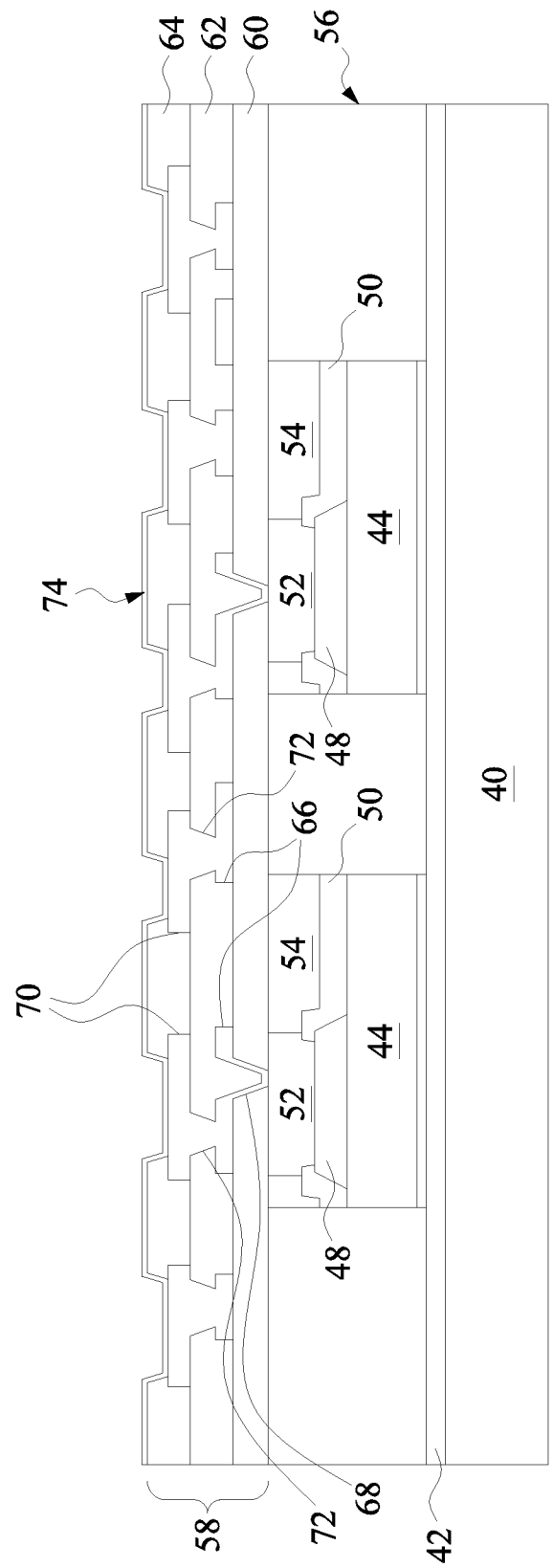

FIG. 5 illustrates the formation of a seed layer 74 on the redistribution structure 58. The seed layer 74 is formed on upper surfaces of the redistribution structure 58, such as the top surface of the third dielectric layer 64, surfaces of openings through the third dielectric layer 64, and surfaces of the second metallization pattern 70 that are exposed by the openings through the third dielectric layer 64. In some embodiments, the seed layer 74 is a metal layer, which may be a single layer or a composite layer comprising a plurality of sub-layers formed of different materials. In some embodiments, the seed layer 74 comprises a titanium layer and a copper layer over the titanium layer. The seed layer may be formed using, for example, PVD or the like.

Figure 6:
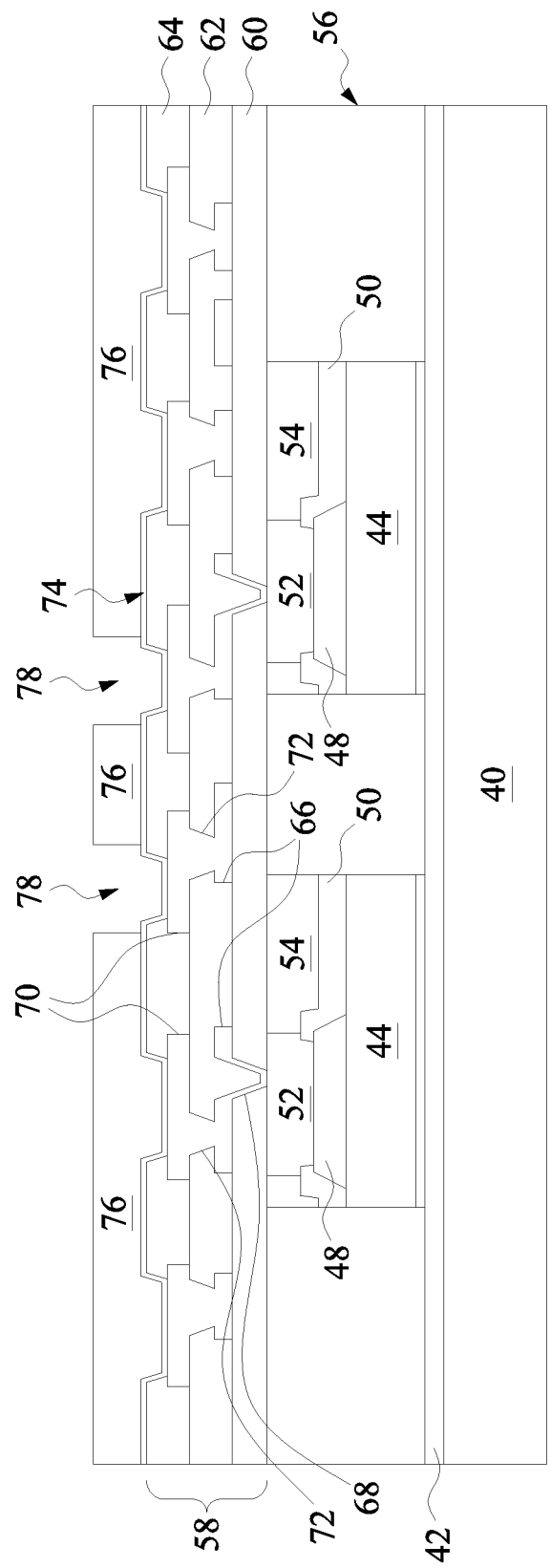

FIG. 6 illustrates the formation of a photo resist 76 on the seed layer 74. The photo resist 76 may be formed by spin coating or the like, and may be exposed to light for patterning using acceptable lithography processes. The patterning forms openings 78 through the photo resist 76 that expose portions of the seed layer 74, at least some of which are on second metallization pattern 70 through openings in the third dielectric layer 64. The openings 78 are located in a central region of the top side of the redistribution structure 58. "Top side" is used for ease to refer to a side of the redistribution structure 58 distal from the integrated circuit dies 44. The openings 78 may each have a width in a range from about 10 μm to about 50 μm, where the width is in a direction parallel to the top side of the redistribution structure 58.

Figure 7:
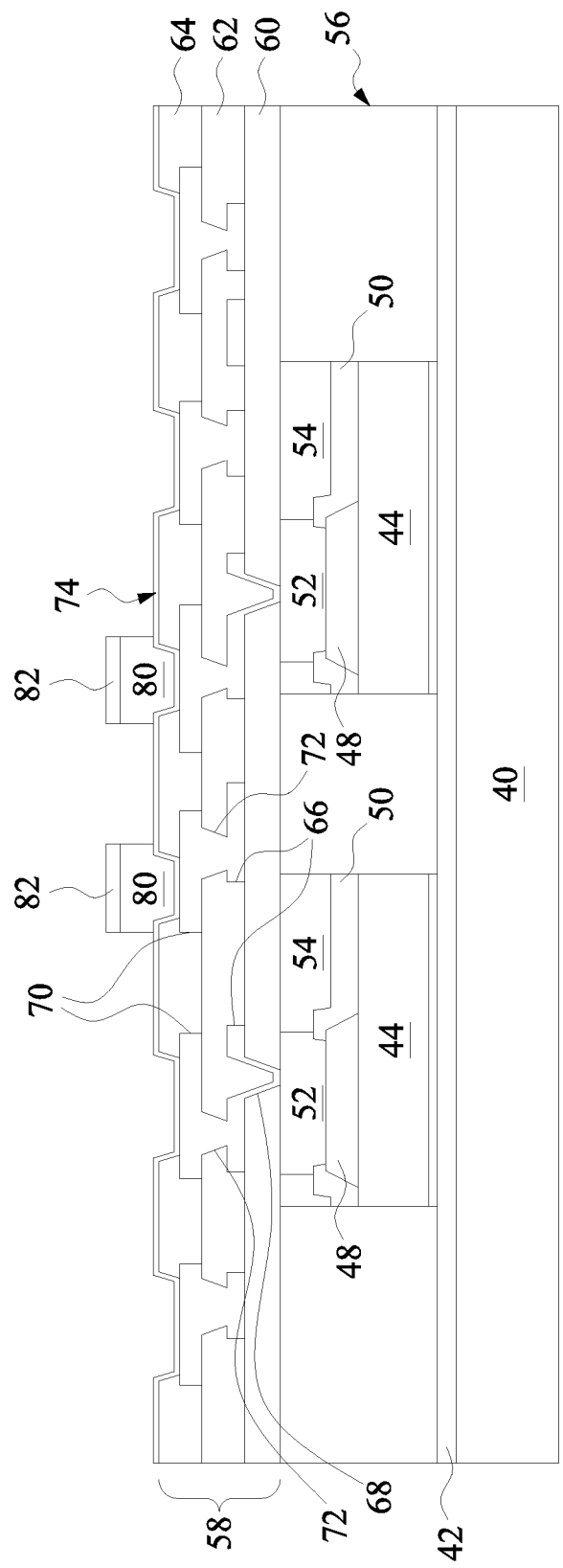

FIG. 7 illustrates the formation of first external electrical connectors. The first external electrical connectors are formed in the central region of the top side of the redistribution structure 58 corresponding to the location of the openings 78. The first external electrical connectors each comprise a first conductive pillar 80 formed on a portion of the seed layer 74 exposed through an opening 78 and a solder 82 formed on the first conductive pillar 80.

The first conductive pillar 80 may be formed by forming a conductive material in the openings 78 of the photo resist 76 and on the exposed portions of the seed layer 74. The conductive material may be formed by plating, such as electroplating or electroless plating, or the like. The conductive material may comprise a metal, like copper, titanium, tungsten, aluminum, or the like, which may have a higher reflow temperature than, e.g., solder. A width of the first conductive pillars 80 corresponds to the width of the openings 78 and may be in a range from about 10 μm to about 50 μm. A height of the first conductive pillars 80 may be in a range from about 10 um to about 40 μm, where the height is perpendicular to the top side of the redistribution structure 58.

The solder 82 may be formed on the first conductive pillars 80 and in the openings 78 using plating such as electroplating or electroless plating, screen printing, or the like. The solder 82 can be any acceptable low-temperature reflowable conductive material, such as a lead-free solder. A width of the solder 82 corresponds to the width of the openings 78 and the first conductive pillars 80 and may be in a range from about 10 μm to about 50 μm. A thickness of the solder 82 may in a range from about 3 μm to about 25 μm, where the thickness is perpendicular to the top side of the redistribution structure 58. A height of the first external electrical connector (e.g., the first conductive pillar 80 and the solder 82) is in a range from about 13 μm to about 65 μm, such as about 25 μm. After forming the solder, the photo resist 76 may be removed by an acceptable ashing or stripping process, such as using an oxygen plasma or the like. The first external electrical connectors are electrically coupled to metallization patterns in the redistribution structure 58, such as second metallization pattern 70, and hence, the first external electrical connectors are electrically coupled to the integrated circuit dies 44.

Figure 8:
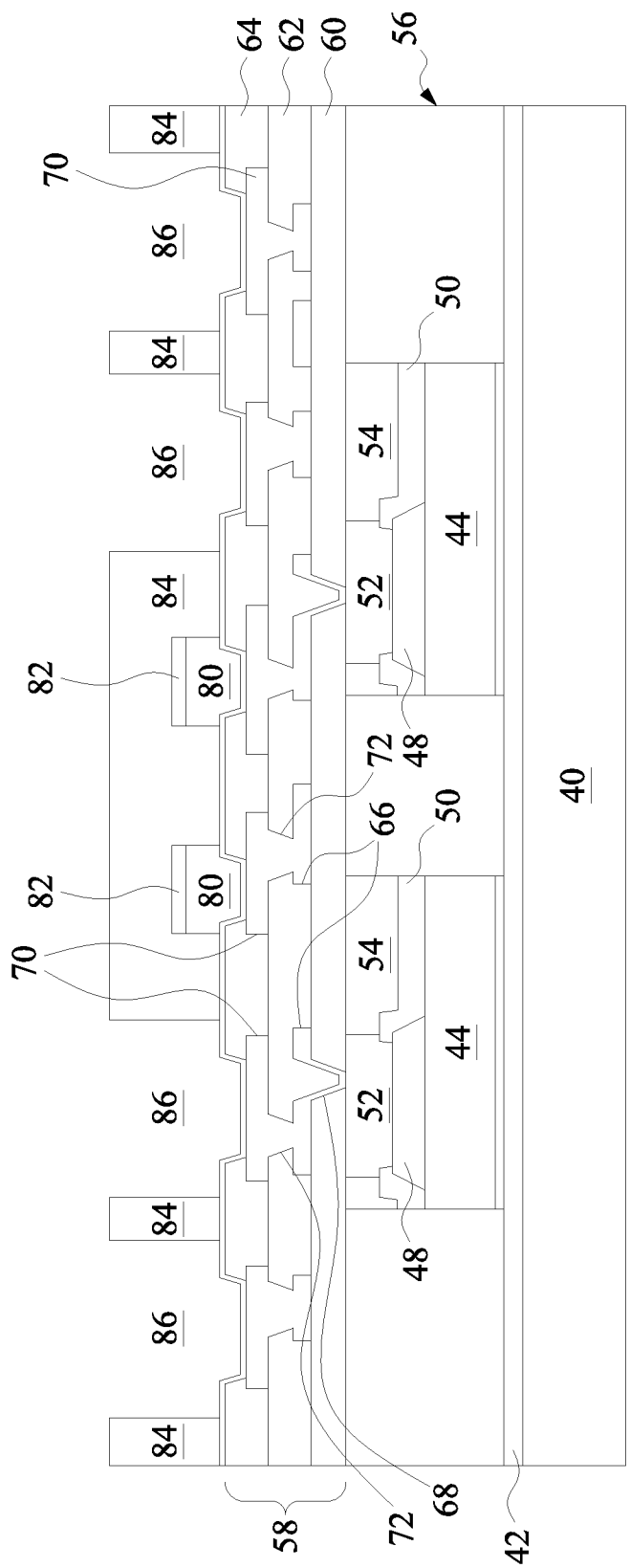

FIG. 8 illustrates the formation of a photo resist 84 on the seed layer 74 and the first external electrical connectors. The photo resist 84 may be formed by spin coating or the like, and may be exposed to light for patterning using acceptable lithography processes. The patterning forms openings 86 through the photo resist 84 that expose portions of the seed layer 74, at least some of which are on the second metallization pattern 70 through openings in the third dielectric layer 64. The openings 86 are located outside of the central region of the top side of the redistribution structure 58 in which the first external electrical connectors are formed. The openings 86 may each have a width in a range from about 60 μm to about 110 μm, where the width is in a direction parallel to the top side of the redistribution structure 58.

Figure 9:
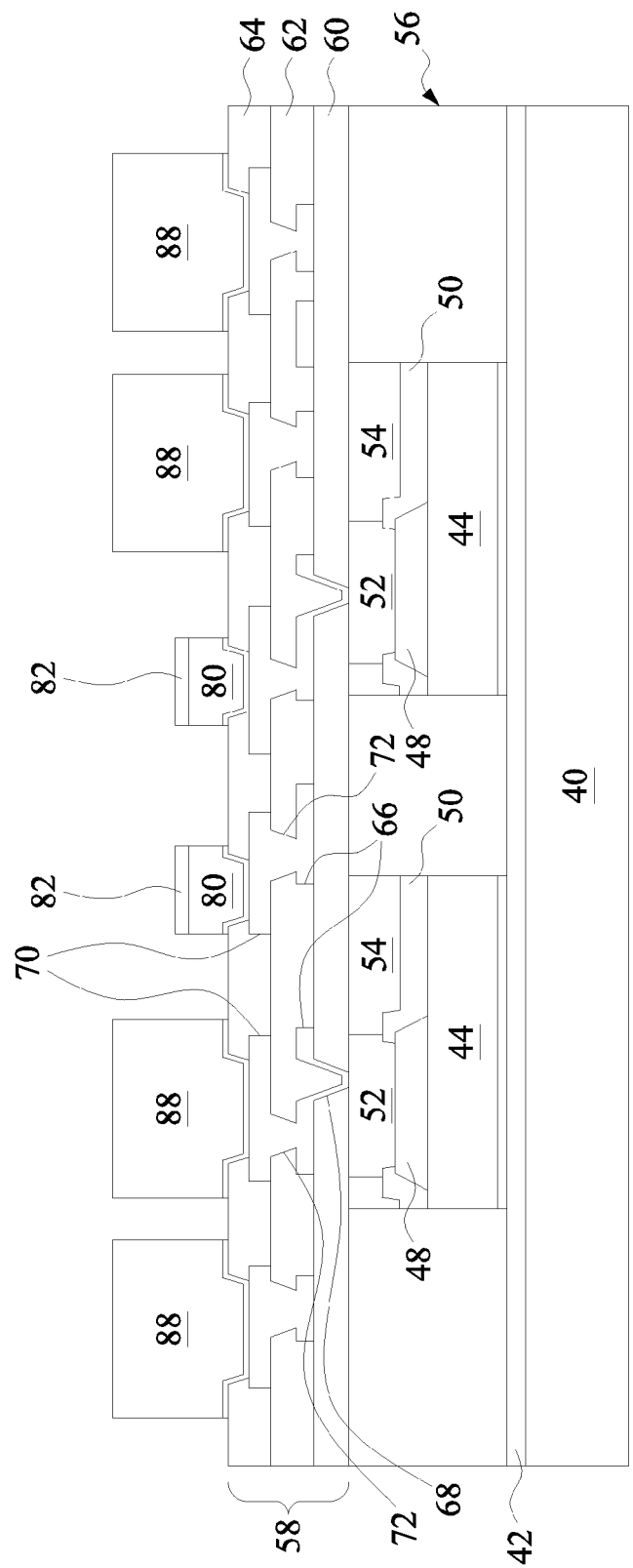

FIG. 9 illustrates the formation of first portions of second external electrical connectors. The second external electrical connectors are formed outside of the central region of the top side of the redistribution structure 58 corresponding to the location of the openings 86. The first portions of the second external electrical connectors each comprise a second conductive pillar 88 formed on a portion of the seed layer 74 exposed through an opening 86. The second conductive pillars 88 may be formed by forming a conductive material in the openings 86 of the photo resist 84 and on the exposed portions of the seed layer 74. The conductive material may be formed by plating, such as electroplating or electroless plating, or the like. The conductive material may comprise a metal, like copper, titanium, tungsten, aluminum, or the like, which may have a higher reflow temperature than, e.g., solder. A width of the second conductive pillars 88 corresponds to the width of the openings 78 and may be in a range from about 60 μm to about 110 μm. A height of the second conductive pillars 88 may be in a range from about 50 μm to about 250 μm, such as 200 μm, where the height is perpendicular to the top side of the redistribution structure 58. The photo resist 84 may then be removed by an acceptable ashing or stripping process, such as using an oxygen plasma or the like. Once the photo resist 84 is removed, portions of the seed layer 74 that are not covered by the first conductive pillars 80 or the second conductive pillars 88 are removed, such as by using an acceptable etching process, such as by wet or dry etching. The first portions of the second external electrical connectors are electrically coupled to metallization patterns in the redistribution structure 58, such as second metallization pattern 70, and hence, the first portions of the second external electrical connectors are electrically coupled to the integrated circuit dies 44.

Figure 10:
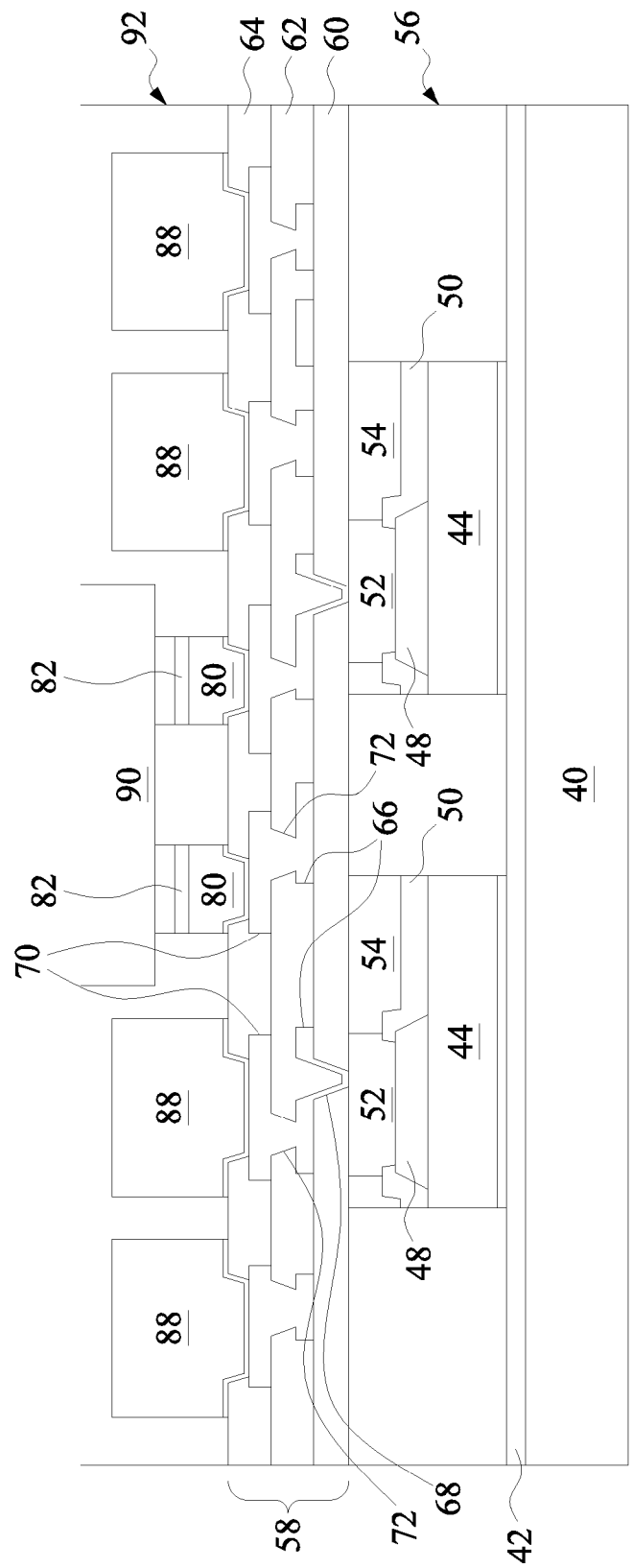

FIG. 10 illustrates attaching an integrated circuit die 90 to the first external electrical connectors and encapsulating the integrated circuit die 90, first external electrical connectors, and the first portions of the second external electrical connectors. The integrated circuit die 90 may be any chip, such as a memory chip, such as a static random access memory (SRAM) chip or dynamic random access memory (DRAM) chip, or the like. Before being attached to the first external electrical connectors, the integrated circuit die 90 may be processed according to applicable manufacturing processes to form integrated circuits in the integrated circuit die 90, as discussed above with respect to the integrated circuit dies 44. For example, the integrated circuit die 90 may have die connectors (not expressly labeled in FIG. 10) formed on what may be referred to as an active side of the integrated circuit die 90, similar to the die connectors 52 on the integrated circuit dies 44 discussed above.

The integrated circuit die 90 can be attached to the first external electrical connectors using a pick-and-place tool or the like. The integrated circuit die 90 is placed such that its active side is facing the redistribution structure 58 and the die connectors of the integrated circuit die 90 come into contact with the solder 82 of the first external electrical connectors. The solder 82 is reflowed forming a connection between the die connectors of the integrated circuit die 90 and the first conductive pillars 80 of the first external electrical connectors.

The integrated circuit die 90, first external electrical connectors, and the first portions of the second external electrical connectors are then encapsulated using an encapsulant 92. The encapsulant 92 is filled into the gap between the integrated circuit die 90 and the redistribution structure 58 and around the first conductive pillars 80 and the second conductive pillars 88. The encapsulant 92 may be a molding compound, an epoxy, an underfill, a molding underfill (MUF), a resin, or the like, and may be applied by compression molding, transfer molding, or the like. A curing step may then be performed to cure and solidify the encapsulant 92. Other encapsulating processes may be used, such as lamination, compression molding, or the like.

Figure 11:
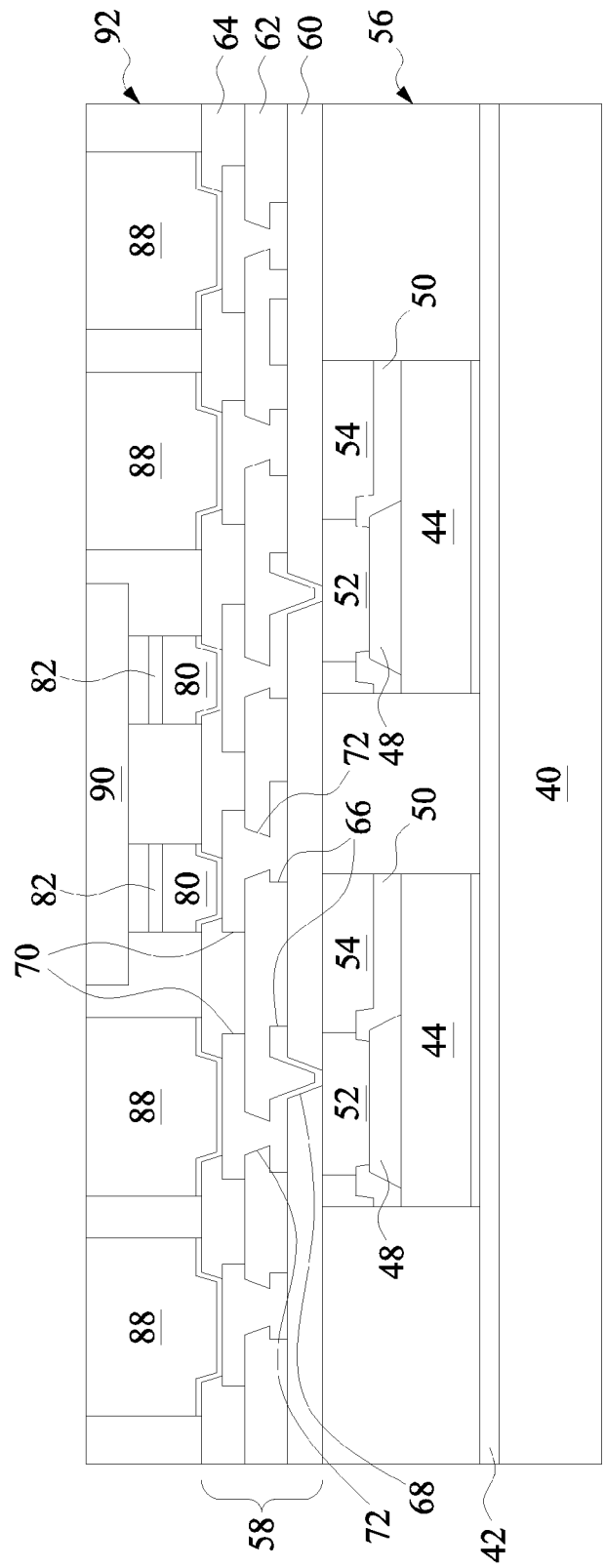

FIG. 11 illustrates the exposure of the second conductive pillars 88 through the encapsulant 92. The second conductive pillars 88 may be exposed by using a grinding, such as a CMP or the like, on the encapsulant 92 and/or the integrated circuit die 90. In some embodiments, the grinding may be omitted, for example, if second conductive pillars 88 are already exposed.

Figure 12:
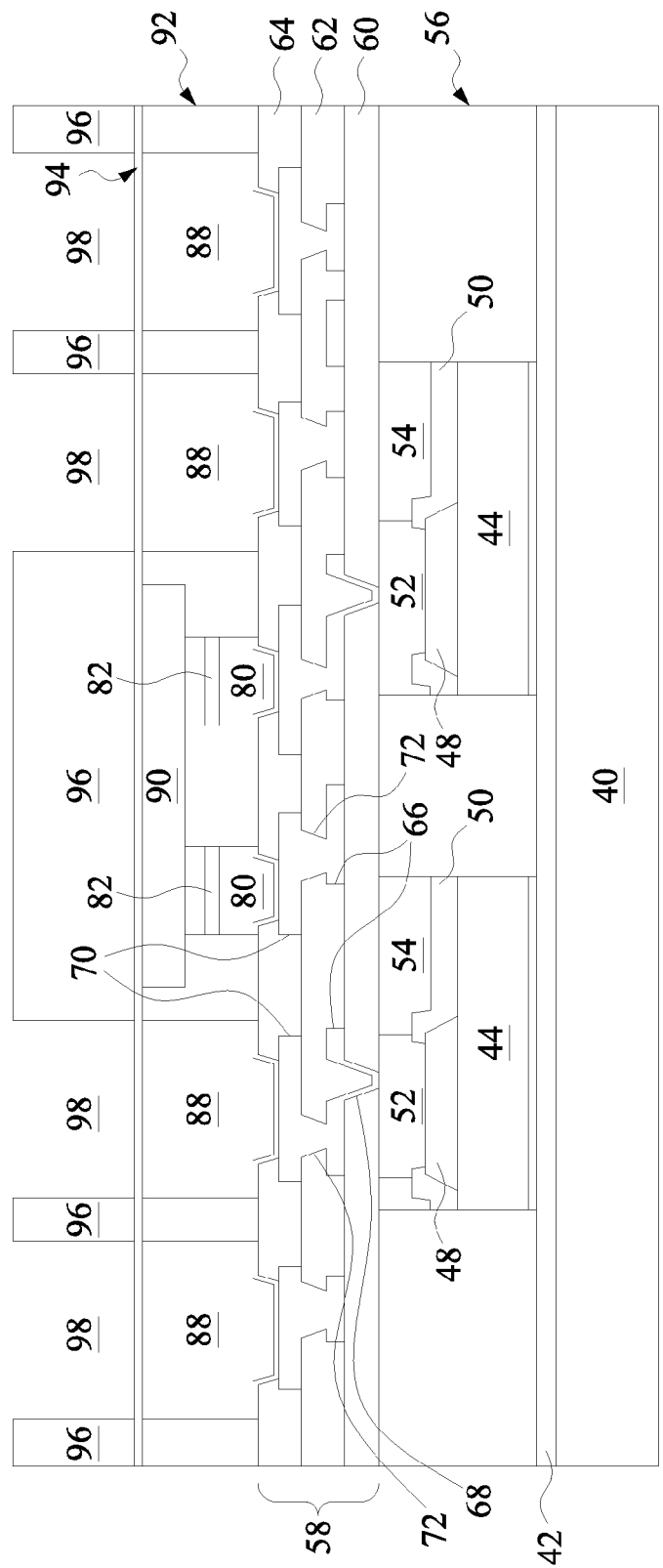

FIG. 12 illustrates the formation of a seed layer 94 on the second conductive pillars 88, encapsulant 92, and integrated circuit die 90, and the formation of a photo resist 96 on the seed layer 94. In some embodiments, the seed layer 94 is a metal layer, which may be a single layer or a composite layer comprising a plurality of sub-layers formed of different materials. In some embodiments, the seed layer 94 comprises a titanium layer and a copper layer over the titanium layer. The seed layer 94 may be formed using, for example, PVD or the like. The photo resist 96 is then formed and patterned on the seed layer 94. The photo resist 96 may be formed by spin coating or the like and may be exposed to light for patterning. The patterning of the photo resist 96 forms openings 98 through the photo resist 96 to expose portions of the seed layer 94. Each opening 98 is formed at least partially directly over a respective one of the second conductive pillars 88. In some embodiments, each opening 98 is wholly laterally coterminous with a respective one of the second conductive pillars 88. The openings 98 may each have a width in a range from about 60 µm to about 110 µm, where the width is in a direction parallel to the top side of the redistribution structure 58.

Figure 13:
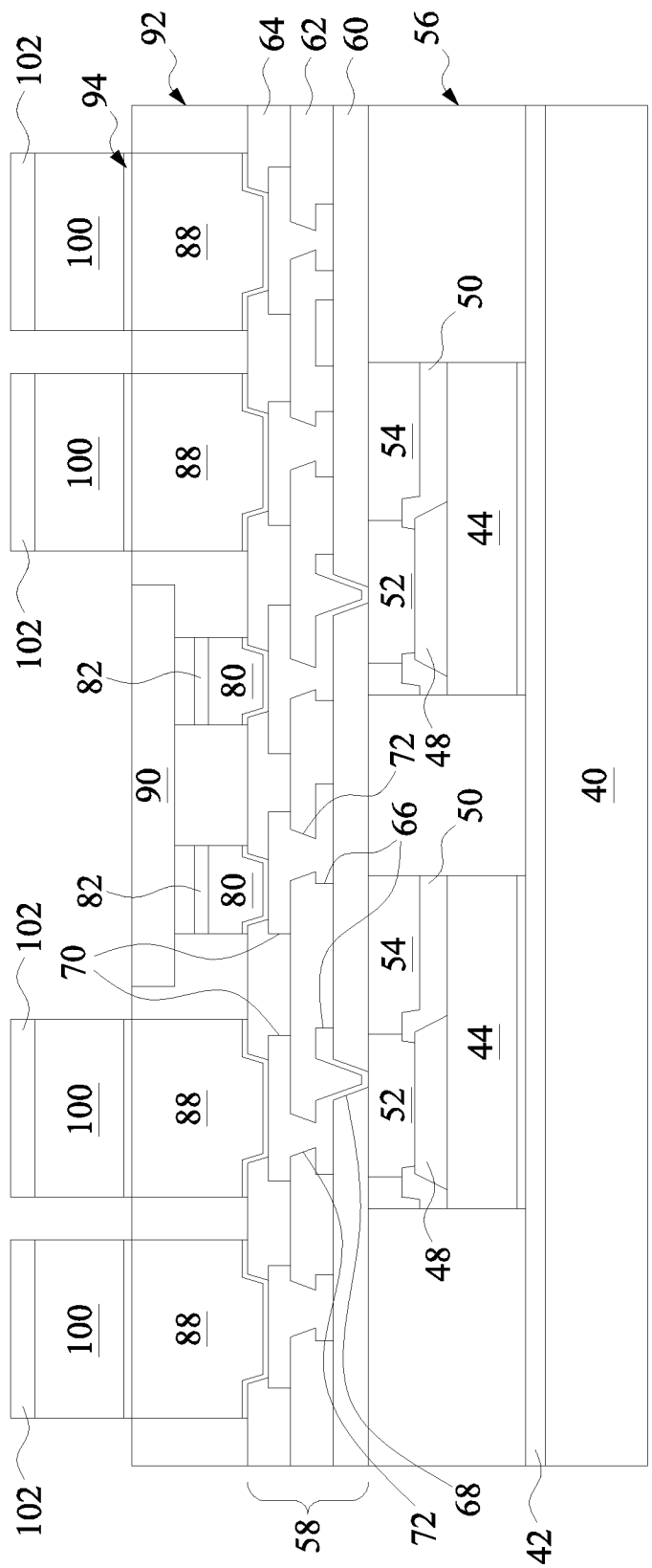

FIG. 13 illustrates the formation of second portions of the second external electrical connectors. The second portions of the second external electrical connectors each comprise a third conductive pillar 100 formed on a portion of the seed layer 94 exposed through an opening 98 and a solder 102 formed on the third conductive pillar 100.

The third conductive pillar 100 may be formed by forming a conductive material in the openings 98 of the photo resist 96 and on the exposed portions of the seed layer 94. The conductive material may be formed by plating, such as electroplating or electroless plating, or the like. The conductive material may comprise a metal, like copper, titanium, tungsten, aluminum, or the like, which may have a higher reflow temperature than, e.g., solder. A width of the third conductive pillars 100 corresponds to the width of the openings 98 and may be in a range from about 60 µm to about 110 µm. A height of the third conductive pillars 100 may be less than about 100 µm, such as in a range from about 20 µm to about 100 µm, such as about 50 µm, where the height is perpendicular to the top side of the redistribution structure 58.

The solder 102 may be formed on the third conductive pillars 100 and in the openings 98 using plating such as electroplating or electroless plating, screen printing, or the like. The solder 102 can be any acceptable low-temperature reflowable conductive material, such as a lead-free solder. A width of the solder 102 corresponds to the width of the openings 98 and the third conductive pillars 100 and may be in a range from about 60 µm to about 110 µm. A thickness of the solder 102 may in a range from about 10 µm to about 40 µm, where the thickness is perpendicular to the top side of the redistribution structure 58. After forming the solder, the photo resist 96 may be removed by an acceptable ashing or stripping process, such as using an oxygen plasma or the like. Once the photo resist 96 is removed, portions of the seed layer 94 that are not covered by the third conductive pillars 100 are removed, such as by using an acceptable etching process, such as by wet or dry etching. The second portions of the second external electrical connectors are electrically coupled to the first portions of the second external electrical connectors, and hence, the second portions of the second external electrical connectors are electrically coupled to the integrated circuit dies 44.

Figure 14:
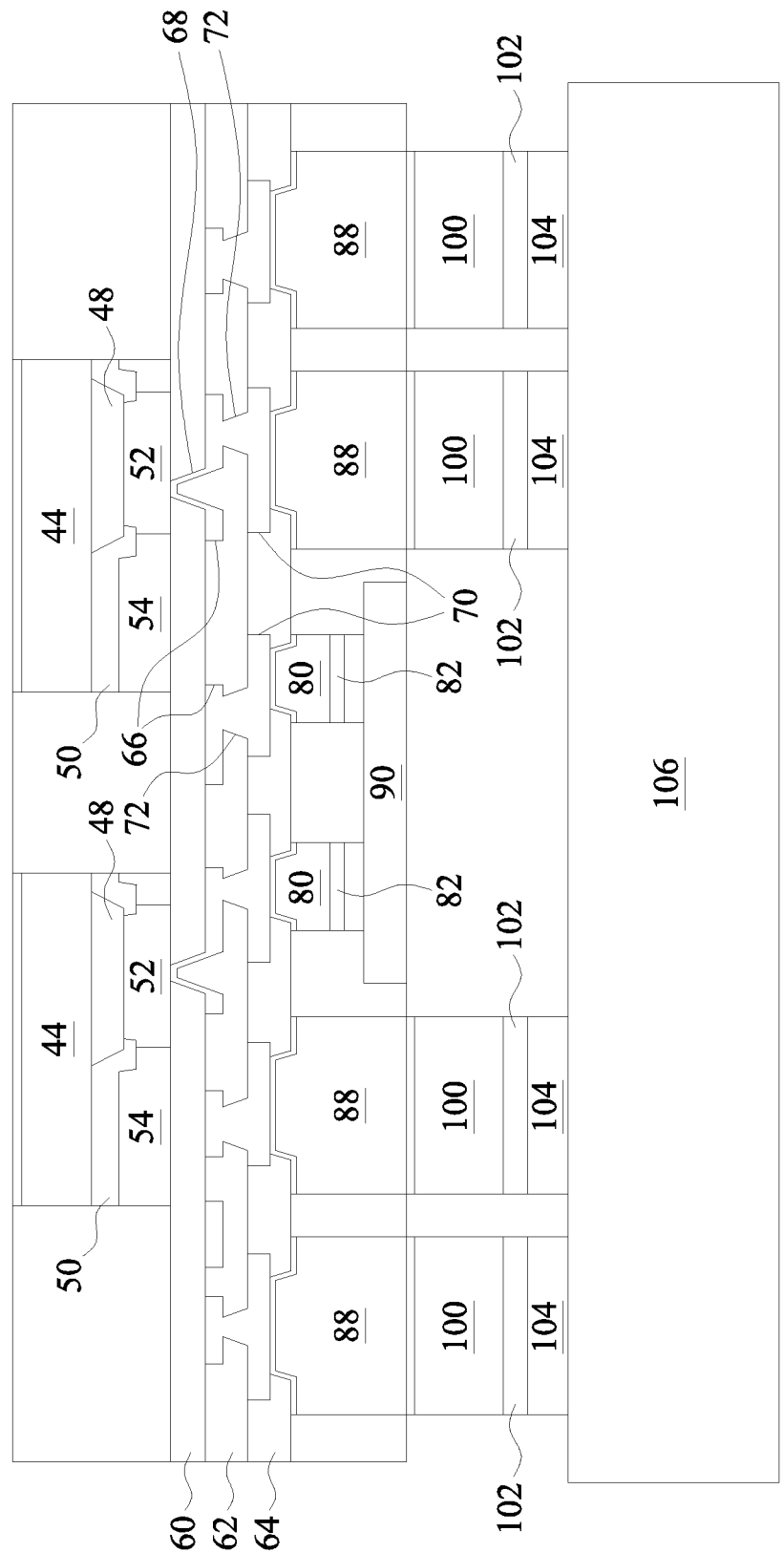

FIG. 14 illustrates a package structure attached to a substrate 106. Before the package structure is attached to the substrate 106, the package structure in FIG. 13 may be de-bonded from the carrier substrate 40 and singulated. As discussed above, the carrier substrate 40 may be a wafer on which many individual package structures, such as illustrated in FIG. 13, are formed simultaneously. Accordingly, multiple package structures may be formed on a wafer-level.

In accordance with some embodiments, the de-bonding includes projecting a light such as a laser light or an UV light on the release layer 42 so that the release layer 42 decomposes under the heat of the light and the carrier substrate 40 can be removed. A cleaning and/or grinding process may be performed to remove residual portions of the release layer 42. The multiple package structures, such as at a wafer-level, are then flipped over and adhered to a dicing tape followed by a singulation process. The singulation process may use a dicing saw or the like. The singulation process can separate individual package structures, such as from the wafer-level.

The package structure is placed on the substrate 106 such that the second electrical connectors, e.g., solder 102, contact pads 104, which may be or comprise metal, on the substrate 106. The solder 102 may be reflowed to connect the package structure to the pads 104 on the substrate 106. The substrate 106 can be a Printed Circuit Board (PCB) or the like.

Figure 15:
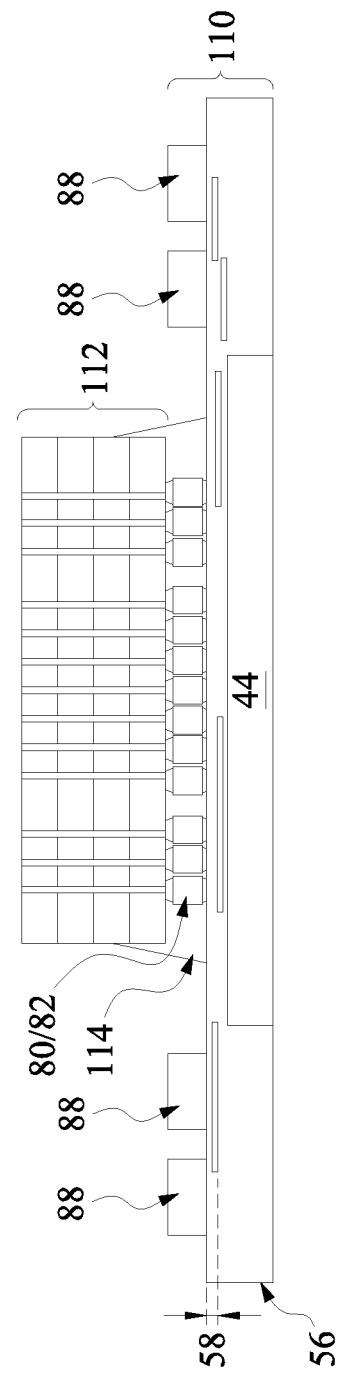
FIGS. 15 through 21 are cross-sectional views of various stages of manufacturing a second package structure in accordance with some embodiments.

FIGS. 15 through 21 illustrate cross-sectional views of various stages of manufacturing a second package structure in accordance with some embodiments. FIG. 15 illustrates stacked dies 112 attached to a package component 110. In the illustrated embodiment, the package component 110 is the same or a similar package component illustrated in FIG. 9, and the package component 110 can undergo processing as discussed above with respect to FIGS. 1 through 9.

The stacked dies 112 can comprise any type, number, or combination of dies. For example, stacked dies 112 can be memory dies, such as SRAM dies or DRAM, processor dies, logic dies, digital dies, analog dies, or the like. Before being attached to the package component 110, each of the stacked dies 112 may be processed according to applicable manufacturing processes to form integrated circuits in the respective stacked dies 112, as discussed above with respect to the integrated circuit dies 44. The stacked dies 112 can be stacked on top of each other using die-to-die bonding or reflowing electrical connectors between the dies. The stacked dies 112 can have through vias (not specifically labeled) to enable electrical coupling between the stacked dies 112.

In some embodiments, the stacked dies 112 are attached to the package components 110 using the first external electrical connectors, e.g. the first conductive pillars 80 and solder 82. The stacked dies 112 can be attached to the first external electrical connectors using a pick-and-place tool or the like. The stacked dies 112 are placed such that an active side of the lower most one of the stacked dies 112 is facing the redistribution structure 58 and the die connectors of the lower most one of the stacked dies 112 come into contact with the solder 82 of the first external electrical connectors. The solder 82 is reflowed forming a connection between the die connectors of the lower most one of the stacked dies 112 and the first conductive pillars 80 of the first external electrical connectors.

An underfill material 114 is then dispensed between the lower most one of the stacked dies 112 and redistribution structure 58 of the package component 110 and around the first external electrical connectors. The underfill material 114 may be an epoxy, resin, or the like, and may be dispensed and cured according to acceptable processes.

Figure 16:
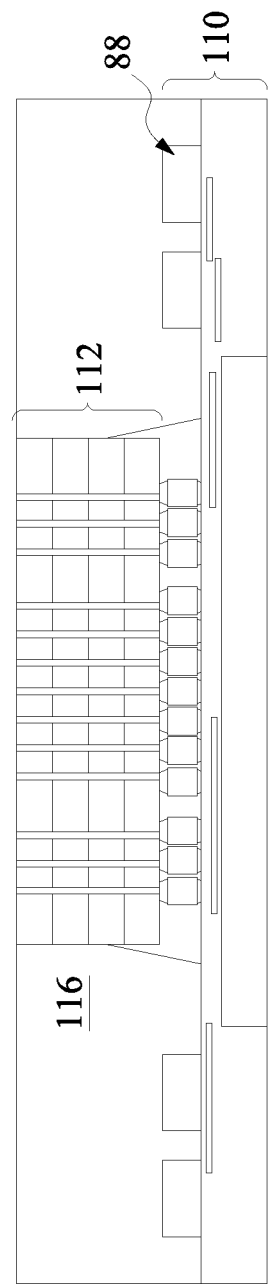

FIG. 16 illustrates encapsulating the stacked dies 112 and the second conductive pillars 88 on the package component 110 using an encapsulant 116. The encapsulant 116 may be a molding compound, an epoxy, an underfill, a molding underfill (MUF), or the like, and may be applied by compression molding, transfer molding, or the like. The encapsulant 116 can fully encapsulate the stacked dies 112, although as depicted, a surface of the stacked dies 112 is exposed through and co-planar with a surface of the encapsulant 116. The surface of the stacked dies 112 can be exposed as a result of the molding process and/or by a grinding process after molding and curing the encapsulant 116.

Figure 17:
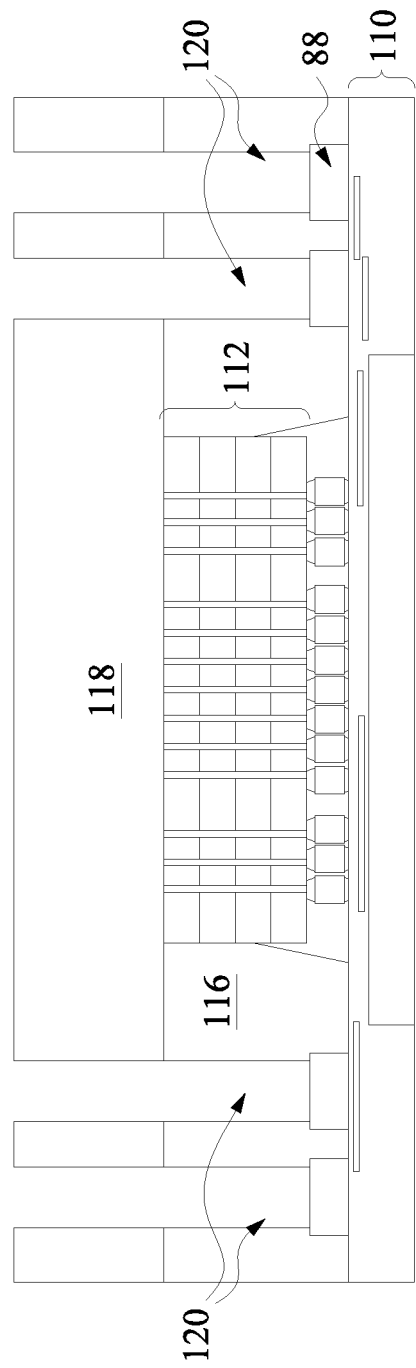

FIG. 17 illustrates the formation of openings 120 in the encapsulant 116 to the second conductive pillars 88. In the illustrated embodiment, a photo resist 118 is formed and patterned on the encapsulant 116 and/or stacked dies 112. The photo resist 118 may be formed by spin coating or the like and may be exposed to light for patterning. The patterning forms openings through the photo resist 118. The openings 120 may then be formed through the encapsulant 116 to respective second conductive pillars 88 by etching using the photo resist 118 as a mask. The etch may be anisotropic, such as Reactive Ion etching (RIE) or the like. After the etching, the photo resist 118 is removed, such as by an acceptable ashing or stripping process. A width of the openings 120 can be in the range from about 60 µm to about 200 µm.

Figure 18:
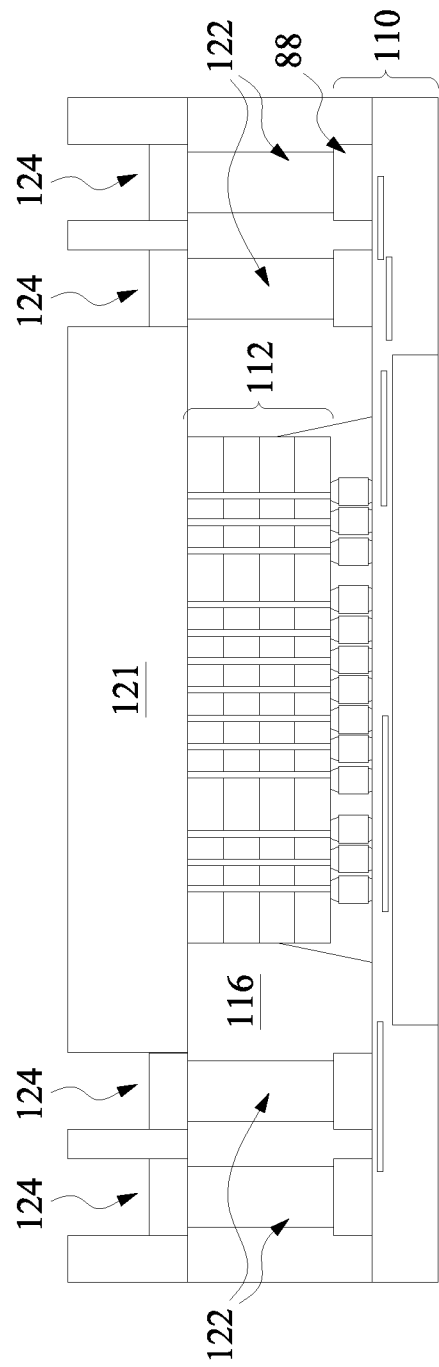

FIG. 18 illustrates the formation of vias 122 in the openings 120 through the encapsulant 116, and the formation of third conductive pillars 124 on the vias 122 and/or encapsulant 116. After removing the photo resist 118, as an example to form the vias 122 and third conductive pillars 124, a seed layer (not shown) is formed on surfaces of the openings 120, the encapsulant 116, and the stacked dies 112. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist 121 is then formed and patterned on the seed layer. The photo resist 121 may be formed by spin coating or the like and may be exposed to light for patterning. The openings through the photo resist 121 correspond with the openings 120 through the encapsulant 116. The openings through the photo resist 121 may be larger, e.g., wider, than the openings 120. The openings through the photo resist 121 can wholly expose the openings 120 and can further expose portions of the seed layer on the top surface of the encapsulant 116. A width of the openings through the photo resist 121 can be in the range from about 70 µm to about 210 µm.

The vias 122 and the third conductive pillars 124 are formed by filling the openings 120 in encapsulant 116 and in the openings through the photo resist 121 with conductive material. The conductive material may be formed by plating, such as electroplating or electroless plating, or the like. The conductive material may comprise a metal, like copper, titanium, tungsten, aluminum, or the like.

Figure 19:
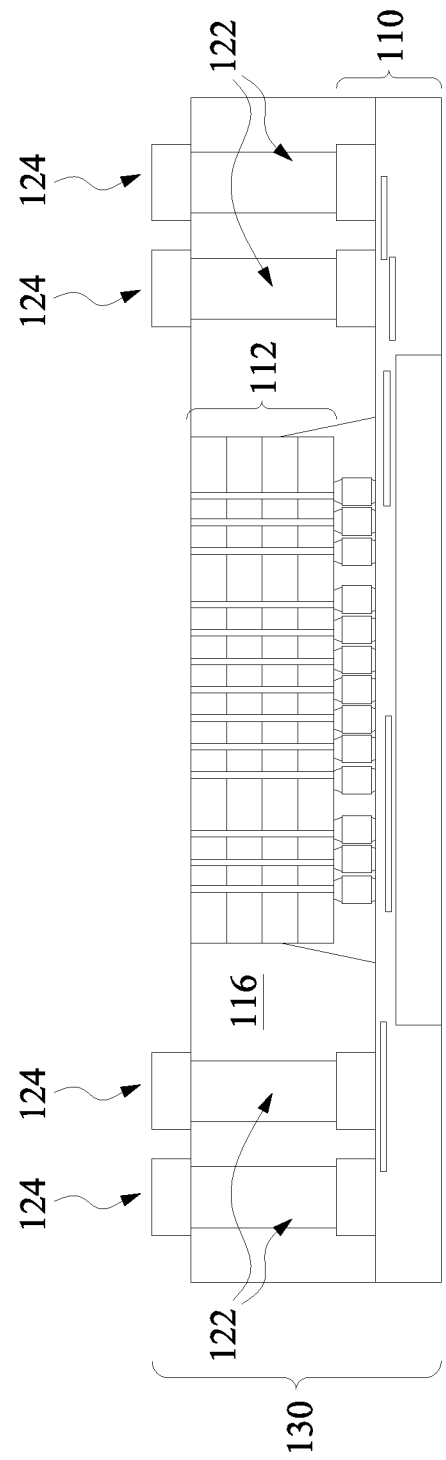

As shown in FIG. 19, the photo resist 121 is removed, such as by an acceptable ashing or stripping process. Once the photo resist 121 is removed, exposed portions of the seed layer are removed, such as by using an acceptable etching process, such as wet etching, dry etching, or the like. A width of the vias 122 may correspond to the width of the openings 120 and may be in a range from about 60 µm to about 200 µm. A width of the third conductive pillars 124 may correspond to the openings in the photo resist 121 and may be in a range from about 70 µm to about 210 µm. A height of the third conductive pillars 124 may be in a range from about 20 µm to about 80 µm.

Similar to what was discussed above, the package structure in FIG. 19 may be de-bonded from a carrier substrate (not specifically illustrated in this embodiment) and singulated. The carrier substrate may be a wafer on which many individual package structures, such as illustrated in FIG. 19, are formed simultaneously. Accordingly, multiple package structures may be formed on a wafer-level.

In accordance with some embodiments, the de-bonding includes projecting a light such as a laser light or an UV light on a release layer so that the release layer decomposes under the heat of the light and the carrier substrate can be removed. A cleaning and/or grinding process may be performed to remove residual portions of the release layer. The multiple package structures, such as at a wafer-level, are then flipped over and adhered to a dicing tape followed by a singulation process. The singulation process may use a dicing saw or the like. The singulation process can separate individual package structures 130, such as from the wafer-level.

Figure 20:
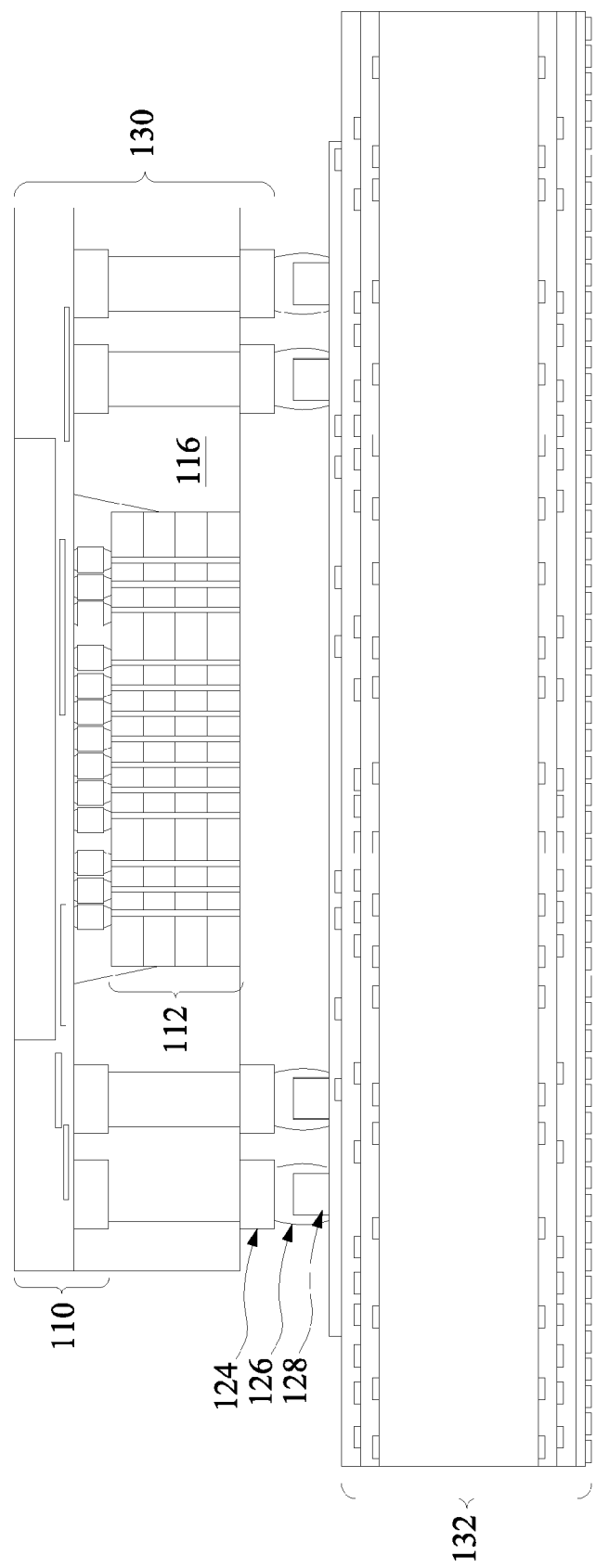

FIG. 20 illustrates a package structure 130 attached to a substrate 132. The substrate 132 can be a PCB or the like. The substrate 132 includes pads 128, which can be or comprise metal. The package structure 130 is electrically and mechanically coupled to the pads 128 on the substrate 132 by the third conductive pillars 124 and solder 126. In some embodiments, the solder 126 can be initially formed on the pads 128 on the substrate 132, and in some embodiments, the solder 126 can be formed on the third conductive pillars 124, in a manner similar to that discussed above with respect to FIG. 13. In some embodiments, the solder 126 can be any low-temperature reflowable material, such as a lead-free solder. The package structure 130 is placed on the substrate 132 such that the third conductive pillars 124 couple pads 128 on the substrate 132, such as with the solder 126 intervening therebetween. The solder 126 may be reflowed to connect the third conductive pillars 124 of the package structure 130 to the pads 128 on the substrate 132.

Figure 21:
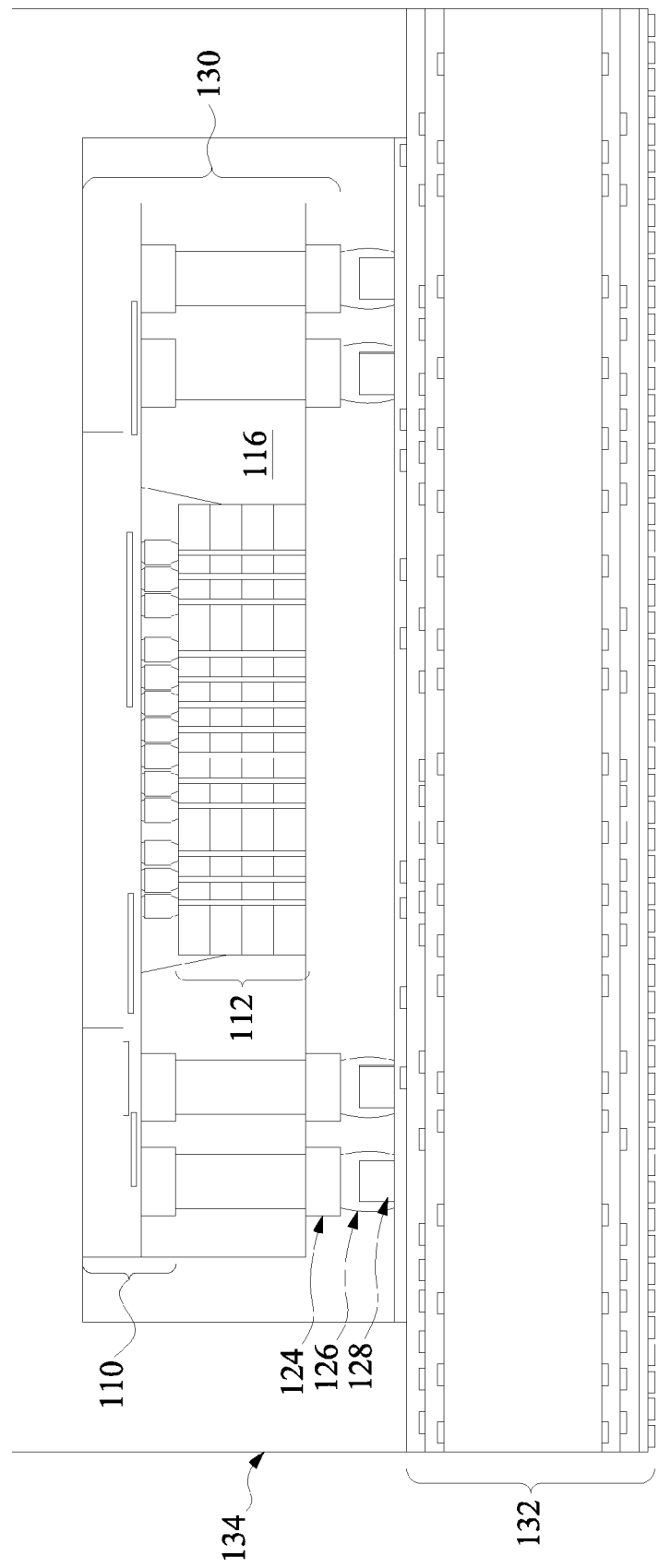

FIG. 21 illustrates a lid 134 covering the package structure 130 and attached to the substrate 132. In some embodiments, the lid 134 may be steel, stainless steel, copper, or the like. The lid 134 may cover and surround the package structure 130. The lid 134 may be attached to the substrate 132 and/or the package structure 130 by an adhesive, such as epoxy, glue, or the like, which may also be a thermally conductive material.

Figure 22:
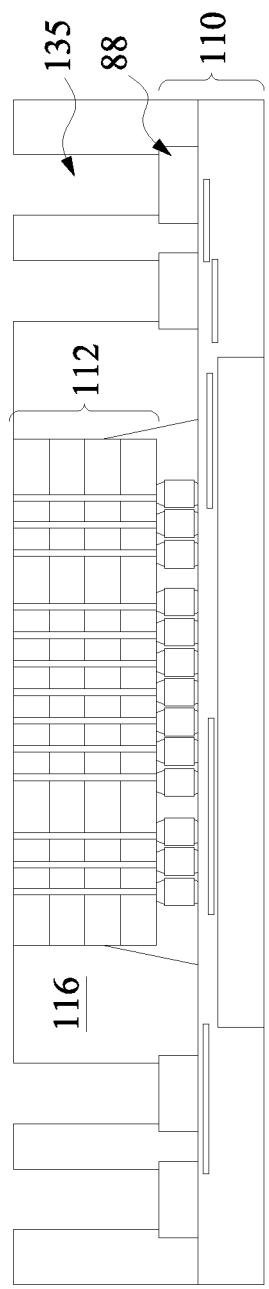
FIG. 22 is a cross-sectional view of a modification of a stage of manufacturing the second package structure in FIGS. 15 through 21 in accordance with some embodiments.

FIG. 22 illustrates a modification of the process shown in FIGS. 15 through 21. The process proceeds as discussed in FIGS. 15 and 16. Then, as shown in FIG. 22, openings 135 are formed in encapsulant 116 using laser drilling. The laser may be a gas laser, a chemical laser, a solid-state laser, a fiber laser, a semiconductor laser, or the like. The process then continues as discussed in FIGS. 18 through 21.

Figure 23:
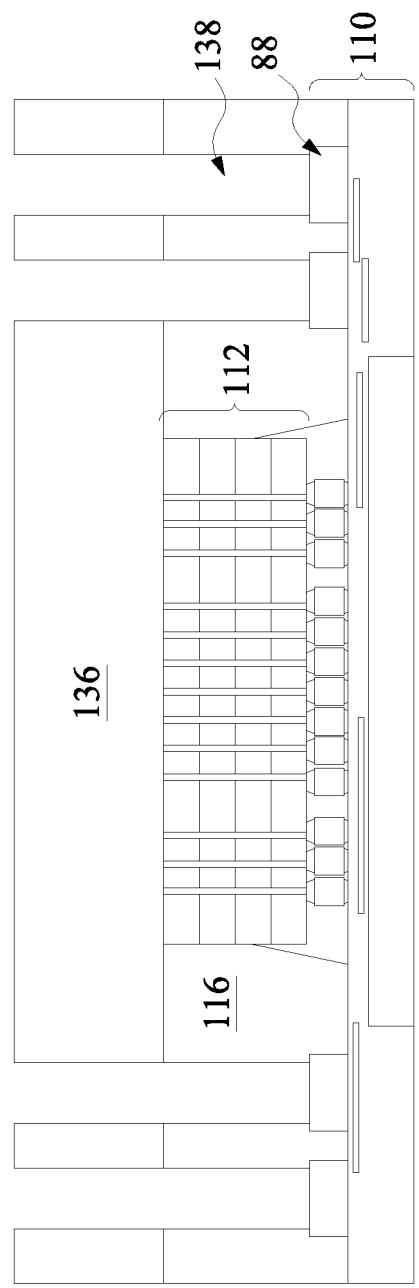
FIG. 23 through 29 are cross-sectional views of various stages of manufacturing a third package structure in accordance with some embodiments.

FIGS. 23 through 29 illustrate cross-sectional views of various stages of manufacturing another package structure in accordance with some embodiments. The process proceeds as discussed in FIGS. 15 and 16. FIG. 23 illustrates the formation of openings 138 in the encapsulant 116 to the second conductive pillars 88. In the illustrated embodiment, a photo resist 136 is formed and patterned on the encapsulant 116 and/or the stacked dies 112. The photo resist 136 may be formed by spin coating or the like and may be exposed to light for patterning. The patterning forms openings through the photo resist 136. The openings 138 may then be formed through the encapsulant 116 to respective second conductive pillars 88 by etching using the photo resist 136 as a mask. The etch may be anisotropic, such as RIE or the like. After the etching, the photo resist 136 is removed, such as by an acceptable ashing or stripping process. In other embodiments, the openings 138 may be formed using another acceptable process, such as laser drilling or the like. A width of the openings 138 may be in a range from about 60 μm to about 200 μm.

Figure 24:
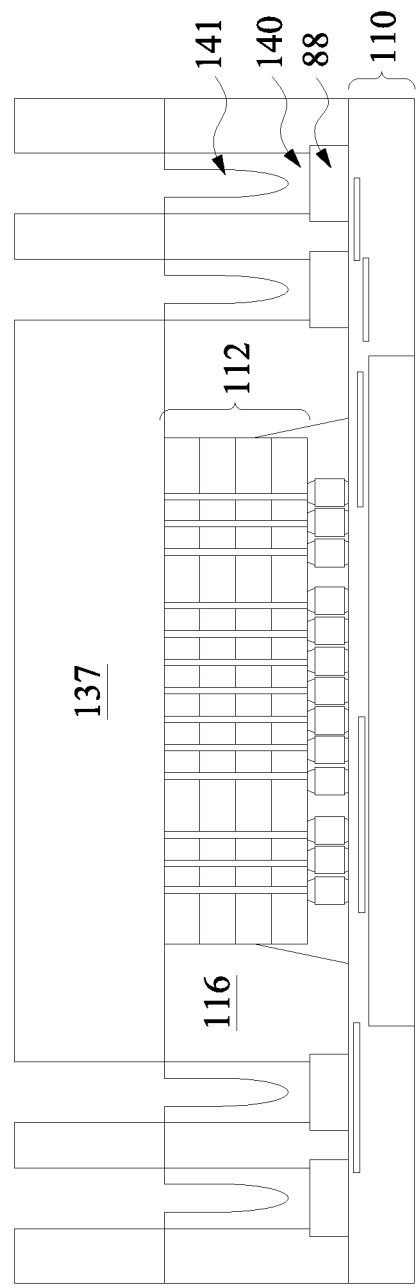

FIG. 24 illustrates the formation of vias in the openings 138 through the encapsulant 116. As illustrated, the vias comprise a conductive material 140 along bottom and sidewall surfaces of the openings 138. The conductive material 140 does not completely fill the openings 138, and respective portions of the openings 138 remain unfilled 141. As an example to form the conductive material 140, after removing the photo resist 136 (if applicable), a seed layer (not shown) is formed on surfaces of the openings 138, the encapsulant 116, and the stacked dies 112. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist 137 is then formed and patterned on the seed layer. The photo resist 137 may be formed by spin coating or the like and may be exposed to light for patterning. The openings of the photo resist 137 correspond with the openings 138 through the encapsulant 116.

The conductive material 140 is then formed on the seed layer on bottom and sidewall surfaces of the openings 138 through the encapsulant 116. The conductive material 140 may be formed by plating, such as electroplating or electroless plating, or the like. The conductive material 140 may comprise a metal, like copper, titanium, tungsten, aluminum, or the like. The conductive material 140 can nucleate on the seed layer and be deposited on the seed layer using, for example, plating, such that the conductive material 140 is formed on the bottom and sidewall surfaces of the opening 138 and an unfilled portion 141 remain in the opening 138 by, for example, terminating the deposition, e.g., plating, before the opening 138 is completely filled. After forming the conductive material 140 in the openings 138, the photo resist 137 is removed, such as by an acceptable ashing or stripping process.

Figure 25:
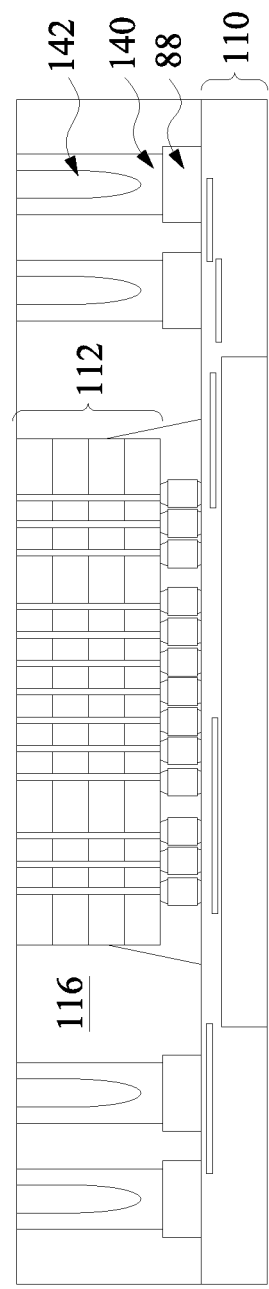

FIG. 25 illustrates the formation of a filler material 142 filling the remaining portions of the openings 138. The filler material 142 can include any acceptable filler material, such as a non-conductive material, e.g., polymer (such as polyimide, PBO, or BCB), silica, or the like; a semiconductor material, e.g., silicon (such as polysilicon) or the like; and/or a conductive material, e.g., copper, titanium, aluminum, or the like. The filler material 142 may be formed in the openings by any acceptable process, such as spin coating, plugging, or the like. A grinding process, such as a CMP, is used to planarize the top surface and to remove the excess portions of the conductive material 140 and/or the filler material 142 on the encapsulant 116 and/or stacked dies 112. In some embodiments, the grinding can remove the seed layer formed as discussed with respect to FIG. 24, and in some embodiments, an etching process can be used to remove that seed layer. As illustrated, by forming the conductive material 140 as described, the conductive material 140 continuously extends from the second conductive pillar 88 to the top surface of the encapsulant 116 such that an electrical connection can be made from a feature formed on the top surface of the encapsulant 116 to the second conductive pillar 88. The remaining portions 141 of the openings 138 are filled with the filler material 142 which is surrounded by the conductive material 140 in respective openings 138. In some embodiments, the filler material 142 can be a material different from the conductive material 140 that allows for less expensive or easier filling of the openings 138. In this way, a via may be formed in the opening 138 by filling the opening with a less expensive or more easily formed material, e.g., the filler material 142.

Figure 26:
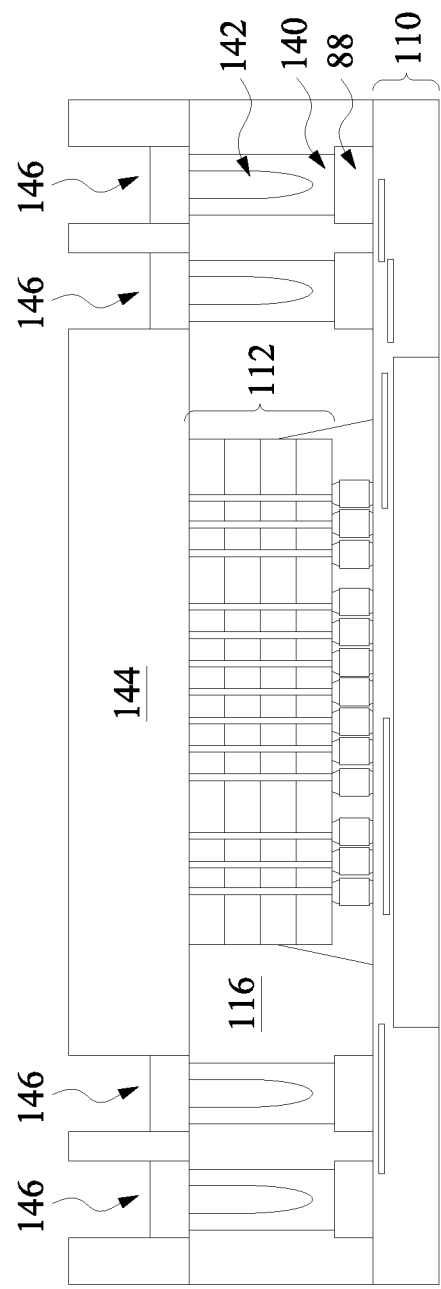

FIG. 26 illustrates the formation of third conductive pillars 146 on the vias through the encapsulant 116 and/or on the encapsulant 116. As an example to form the third conductive pillars 146, a seed layer (not shown) is formed on the vias (e.g., the conductive material 140 and the filler material 142), the encapsulant 116, and the stacked dies 112. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist 144 is then formed and patterned on the seed layer. The photo resist 144 may be formed by spin coating or the like and may be exposed to light for patterning to form openings through the photo resist 144. The openings through the photo resist 144 correspond with the vias through the encapsulant 116. The openings through the photo resist 144 may be larger, e.g., wider, than the vias. The openings through the photo resist 144 can wholly expose the vias through the encapsulant 116 and can further expose portions of the seed layer on the top surface of the encapsulant 116. A width of the openings through the photo resist 144 can be in the range from about 70 µm to about 210 µm.

The third conductive pillars 146 are formed by filling the openings through the photo resist 144 with conductive material. The conductive material may be formed by plating, such as electroplating or electroless plating, or the like. The conductive material may comprise a metal, like copper, titanium, tungsten, aluminum, or the like, which may have a higher reflow temperature than, e.g., solder.

Figure 27:
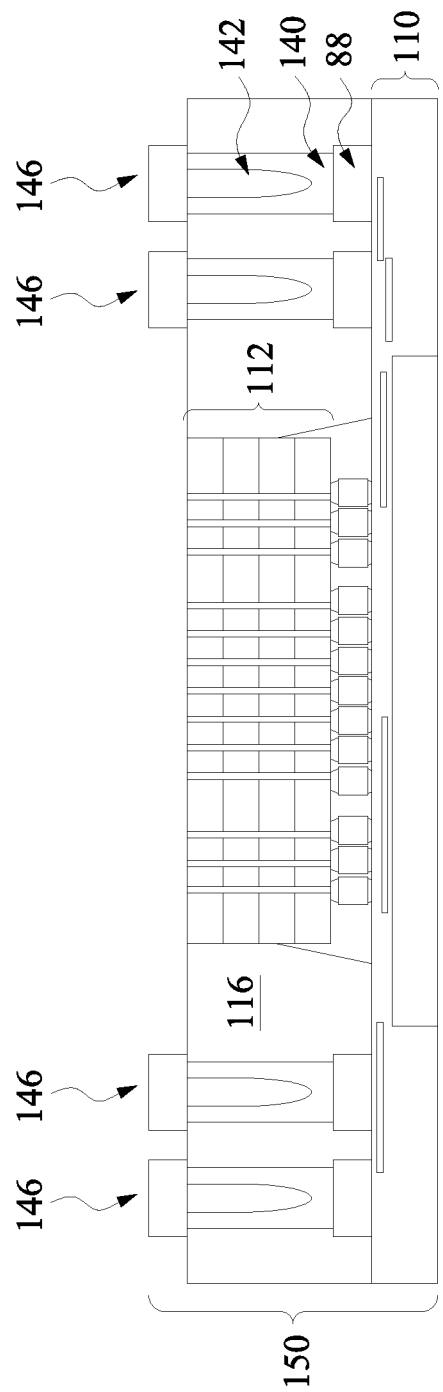

FIG. 27 illustrates the removal of the photo resist 144. The photo resist 144 may be removed by an acceptable ashing or stripping process, such as using an oxygen plasma or the like. Once the photo resist 144 is removed, exposed portions of the seed layer are removed, such as by using an acceptable etching process, such as wet etching, dry etching, or the like. A width of the third conductive pillars 146 may correspond to the openings in the photo resist 144 and may be in a range from about 70 µm to about 210 µm. A height of the third conductive pillars 146 may be in a range from about 20 µm to about 80 µm. The third conductive pillars 146 are electrically coupled to the conductive material 140 of the vias through the encapsulant 116.

Similar to what was discussed above, the package structure in FIG. 27 may be de-bonded from a carrier substrate (not specifically illustrated in this embodiment) and singulated. The carrier substrate may be a wafer on which many individual package structures, such as illustrated in FIG. 27, are formed simultaneously. Accordingly, multiple package structures may be formed on a wafer-level.

In accordance with some embodiments, the de-bonding includes projecting a light such as a laser light or an UV light on a release layer so that the release layer decomposes under the heat of the light and the carrier substrate can be removed. A cleaning and/or grinding process may be performed to remove residual portions of the release layer. The multiple package structures, such as at a wafer-level, are then flipped over and adhered to a dicing tape followed by a singulation process. The singulation process may use a dicing saw or the like. The singulation process can separate individual package structures 150, such as from the wafer-level.

Figure 28:
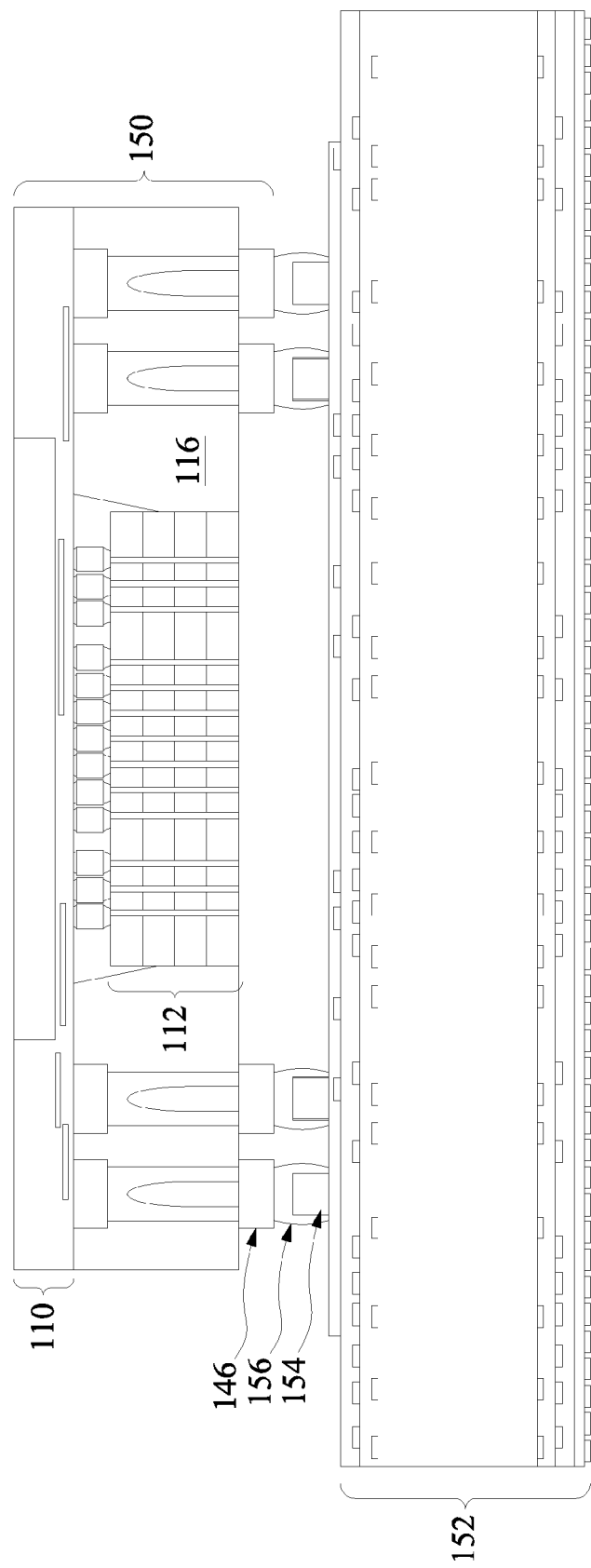

FIG. 28 illustrates a package structure 150 attached to a substrate 152. The substrate 152 can be a PCB or the like. The substrate 152 includes pads 154, which can be or comprise metal. The package structure 150 is electrically and mechanically coupled to the pads 154 on the substrate 152 by the third conductive pillars 146 and solder 156. In some embodiments, the solder 156 can be initially formed on the pads 154 on the substrate 152, and in some embodiments, the solder 156 can be formed on the third conductive pillars 146, in a manner similar to that discussed above with respect to FIG. 13. In some embodiments, the solder 156 can be any low-temperature reflowable material, such as a lead-free solder. The package structure 150 is placed on the substrate 152 such that the third conductive pillars 146 couple pads 154 on the substrate 152, such as with the solder 156 intervening therebetween. The solder 156 may be reflowed to connect the third conductive pillars 146 of the package structure 150 to the pads 154 on the substrate 152.

Figure 29:
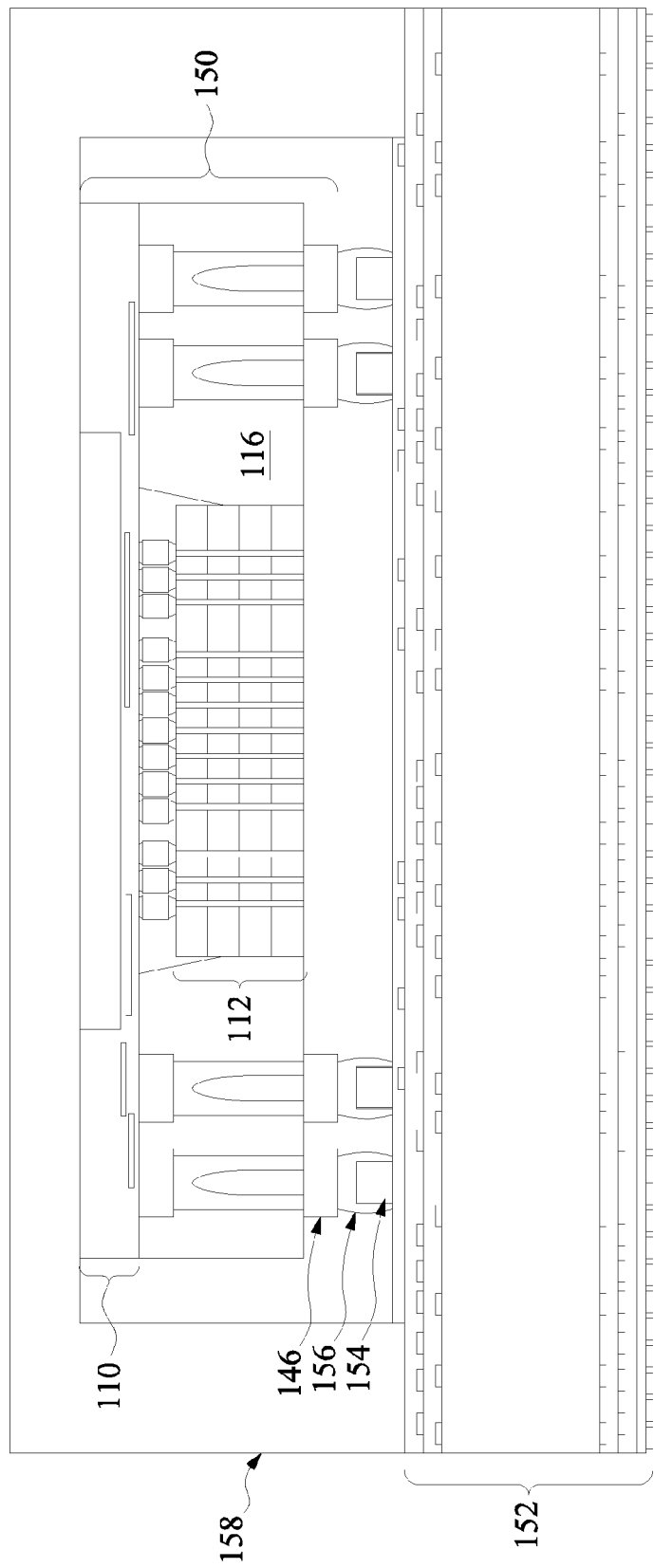

FIG. 29 illustrates a lid 158 covering the package structure 150 and attached to the substrate 152. In some embodiments, the lid 158 may be steel, stainless steel, copper, or the like. The lid 158 may cover and surround the package structure 150. The lid 158 may be attached to the substrate 152 and/or the package structure 150 by an adhesive, such as epoxy, glue, or the like, which may also be a thermally conductive material.

Some embodiments may achieve advantages. In a conventional solder joint structure, the interconnection between a package and a substrate can be made by peripheral solder joints that have a minimum height criteria. However, the conventional solder joint can encounter a high bridging risk when input/output (I/O) counts increase, e.g., the solder joint density increases and reduces pitches between solder joints. In some embodiments, interconnections between a package and a substrate can have increased I/O counts with high yield and reduced bridging risks. By having various external electrical connectors and/or conductive pillars as discussed, rigidity of various interconnects can be increased, and an amount of solder necessary for forming the interconnections may be reduced, which can reduce a bridging risk between the interconnections. This may facilitate high density interconnections with small pitches.

An embodiment is a structure. The structure includes a first die, a first encapsulant at least laterally encapsulating the first die, and a redistribution structure on the first die and the first encapsulant. The first die has a first active side, and the redistribution structure is on the first active side of the first die. A second die has a second active side, and the second active side of the second die is attached by a first external electrical connector to the redistribution structure. The second die is on an opposite side of the redistribution structure from the first die. A second encapsulant is on the redistribution structure and at least laterally encapsulates the second die. The second encapsulant has a first surface distal from the redistribution structure. A conductive feature extends from the redistribution structure through the second encapsulant to the first surface of the second encapsulant. A first conductive pillar is on the conductive feature, and the first conductive pillar protrudes from the first surface of the second encapsulant.

Another embodiment is a structure. The structure comprises a package component. The package component comprises a redistribution structure on an encapsulated first die. First conductive pillars are on the redistribution structure and are at least laterally encapsulated by a first encapsulant. A second die is on the redistribution structure and is at least laterally encapsulated by the first encapsulant. The first encapsulant has a first surface distal from the redistribution structure. Second conductive pillars protrude from the first surface of the first encapsulant. Each of the second conductive pillars is electrically coupled to a respective one of the first conductive pillars.

A further embodiment is a method. A first die is encapsulated with a first encapsulant. A redistribution structure is formed on the first die and the first encapsulant. A first conductive pillar is formed on the redistribution structure and in a central region of the redistribution structure. A second conductive pillar is formed on the redistribution structure and in a periphery region of the redistribution structure. A width of the first conductive pillar is less than a width of the second conductive pillar. A second die is attached to the redistribution structure using the first conductive pillar. The second die and the second conductive pillar are at least laterally encapsulated with a second encapsulant. After encapsulating the second die and the second conductive pillar, a third conductive pillar is formed electrically coupled to the second conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first die having a first active side;
a first encapsulant at least laterally encapsulating the first die;
a redistribution structure on the first encapsulant and the first active side of the first die;
a second die having a second active side, the second active side of the second die being attached by a first external electrical connector to the redistribution structure, the second die being on an opposite side of the redistribution structure from the first die;
a second encapsulant on the redistribution structure and at least laterally encapsulating the second die, the second encapsulant having a first surface distal from the redistribution structure;
a conductive feature extending from the redistribution structure through the second encapsulant to the first surface of the second encapsulant; and
a first conductive pillar on the conductive feature, the first conductive pillar protruding from the first surface of the second encapsulant.

2. The structure of claim 1, wherein the conductive feature is a second conductive pillar extending from the redistribution structure to the first surface of the second encapsulant.

3. The structure of claim 1, wherein the conductive feature comprises a second conductive pillar on the redistribution structure and a via extending from the second conductive pillar to the first surface of the second encapsulant.

4. The structure of claim 3, wherein the via is defined by an opening extending from the first surface of the second encapsulant to the second conductive pillar, the via comprising a conductive material fully filling the opening.

5. The structure of claim 3, wherein the via comprises a conductive material and a filler material different from the conductive material.

6. The structure of claim 1, wherein the first external electrical connector comprises a second conductive pillar on the redistribution structure, and the conductive feature comprises a third conductive pillar on the redistribution structure, a first width of the second conductive pillar being less than a second width of the third conductive pillar.

7. The structure of claim 1, wherein the first conductive pillar is attached to a substrate by solder.

8. The structure of claim 1, wherein the second die is one of a stack of dies.

9. A structure comprising:
a package component comprising a redistribution structure on an encapsulated first die;
first conductive pillars on the redistribution structure at least laterally encapsulated by a first encapsulant;
a second die on the redistribution structure at least laterally encapsulated by the first encapsulant, the first encapsulant having a first surface distal from the redistribution structure; and
second conductive pillars protruding from the first surface of the first encapsulant, each of the second conductive pillars being electrically coupled to a respective one of the first conductive pillars, wherein the second conductive pillars protrude from the first surface of the first encapsulant such that opposing sidewalls of the second conductive pillars are uncovered by the first encapsulant.

10. The structure of claim 9, wherein the first conductive pillars extend from the redistribution structure to the first surface of the encapsulant.

11. The structure of claim 9 further comprising vias in the first encapsulant, each via extending from a respective one of the first conductive pillars to a respective one of the second conductive pillars.

12. The structure of claim 11, wherein each via comprises a conductive material and a filler material different from the conductive material, the conductive material at least laterally surrounding the filler material.

13. The structure of claim 9, wherein the second die is attached to the redistribution structure using third conductive pillars, a width of the third conductive pillars being less than a width of the first conductive pillars.

14. The structure of claim 9, wherein the second die is one of stacked dies.

15. A method comprising:
encapsulating a first die with a first encapsulant;
forming a redistribution structure on the first die and the first encapsulant;
forming a first conductive pillar on the redistribution structure and in a central region of the redistribution structure;
forming a second conductive pillar on the redistribution structure and in a periphery region of the redistribution structure, a width of the first conductive pillar being less than a width of the second conductive pillar;
attaching a second die to the redistribution structure using the first conductive pillar;
at least laterally encapsulating the second die and the second conductive pillar with a second encapsulant; and
after encapsulating the second die and the second conductive pillar, forming a third conductive pillar electrically coupled to the second conductive pillar.

16. The method of claim 15, wherein each of the forming the first conductive pillar, the forming the second conductive pillar, and the forming the third conductive pillar comprises using a plating process.

17. The method of claim 15, wherein the third conductive pillar is formed directly on the second conductive pillar.

18. The method of claim 15 further comprising:
forming an opening through the encapsulant exposing the second conductive pillar; and
forming a via in the openings, the via comprising a conductive material, the third conductive pillar being formed directly on the via.

19. The method of claim 18, wherein the conductive material completely fills the opening.

20. The method of claim 18, wherein the forming the via comprises:
    forming the conductive material along a sidewall surface of the opening and a bottom surface of the opening, wherein an unfilled portion of the opening remains unfilled; and
    forming a filler material in the unfilled portion of the opening, the filler material being a different material than the conductive material.

* * * * *